(12) United States Patent
Her et al.

(10) Patent No.: US 11,335,764 B2
(45) Date of Patent: May 17, 2022

(54) DISPLAY INCLUDING PLURALITY OF WIRINGS BYPASSING HOLE AREA ENCOMPASSED BY DISPLAY AREA, AND ELECTRONIC DEVICE INCLUDING SAME

(71) Applicant: Samsung Electronics Co., Ltd., Suwon-si (KR)

(72) Inventors: Yongkoo Her, Suwon-si (KR); Harksang Kim, Suwon-si (KR); Songhee Jung, Suwon-si (KR); Hyunchang Shin, Suwon-si (KR); Byungduk Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/041,174

(22) PCT Filed: Apr. 15, 2019

(86) PCT No.: PCT/KR2019/004481
§ 371 (c)(1),
(2) Date: Sep. 24, 2020

(87) PCT Pub. No.: WO2019/199139
PCT Pub. Date: Oct. 17, 2019

(65) Prior Publication Data
US 2021/0013298 A1 Jan. 14, 2021

(30) Foreign Application Priority Data

Apr. 13, 2018 (KR) .......................... 10-2018-0043563

(51) Int. Cl.
*G09G 5/00* (2006.01)
*G09G 3/32* (2016.01)
(Continued)

(52) U.S. Cl.
CPC ....... *H01L 27/3276* (2013.01); *G09G 3/3233* (2013.01); *G09G 3/3275* (2013.01);
(Continued)

(58) Field of Classification Search
CPC ............ H01L 27/3276; H01L 27/3234; H01L 27/3262; G09G 3/32; G09G 3/3233;
(Continued)

(56) References Cited

U.S. PATENT DOCUMENTS 10,108,149 B2 10/2018 Kang et al.
10,304,913 B2 * 5/2019 Choi .................... H01L 51/5237
(Continued)

FOREIGN PATENT DOCUMENTS

KR 10-2008-0045637 A 5/2008
KR 10-2016-0147116 A 12/2016
(Continued)

*Primary Examiner* — Pegeman Karimi
(74) *Attorney, Agent, or Firm* — Jefferson IP Law, LLP

(57) ABSTRACT

Disclosed is a display having at least one hole formed in a display area on which an image is displayed, and an electronic device including same. The electronic device comprises a display including the display area having a plurality of pixels and a plurality of wirings, wherein the display includes: a hole area encompassed by the display area; a plurality of first wirings extending from a first side of the display area so as to be formed at first intervals, and connected to the side opposite to the first side; second wirings extending from a second side of the display area so as to be arranged at the first intervals on the side opposite to the second side; and a plurality of third wirings extending from the first side of the display area.

14 Claims, 19 Drawing Sheets

(51) Int. Cl.
*H01L 27/32* (2006.01)
*G09G 3/3233* (2016.01)
*G09G 3/3275* (2016.01)

(52) U.S. Cl.
CPC ...... *H01L 27/3234* (2013.01); *H01L 27/3262* (2013.01); *G09G 2310/0264* (2013.01); *G09G 2310/08* (2013.01); *G09G 2320/02* (2013.01); *G09G 2320/0233* (2013.01); *G09G 2340/0407* (2013.01)

(58) Field of Classification Search
CPC ......... G09G 3/3275; G09G 2310/0264; G09G 2320/0233; G09G 2340/0407; G09G 5/08; G09G 5/00; G06F 3/033; G06F 3/02
See application file for complete search history.

(56) References Cited

U.S. PATENT DOCUMENTS

| | | | |
|---|---|---|---|
| 2008/0117497 A1* | 5/2008 | Shimodaira | G02F 1/136286 359/296 |
| 2009/0051636 A1* | 2/2009 | Natori | G09G 3/3648 345/87 |
| 2017/0154566 A1* | 6/2017 | Ryoo | G09G 3/3648 |
| 2017/0162111 A1* | 6/2017 | Kang | G09G 3/3233 |
| 2018/0337219 A1 | 11/2018 | Rhee et al. | |

FOREIGN PATENT DOCUMENTS

| | | |
|---|---|---|
| KR | 10-2017-0064598 A | 6/2017 |
| KR | 10-2017-0066767 A | 6/2017 |
| KR | 10-2017-0122887 A | 11/2017 |
| WO | 2018-212629 A1 | 11/2018 |

\* cited by examiner

DISPLAY INCLUDING PLURALITY OF WIRINGS BYPASSING HOLE AREA ENCOMPASSED BY DISPLAY AREA, AND ELECTRONIC DEVICE INCLUDING SAME

TECHNICAL FIELD

Various embodiments disclose a display having at least one hole area formed in a display area in which an image is displayed, and an electronic device including the same.

BACKGROUND ART

In line with the recent development of digital technology, various types of electronic devices such as mobile communication terminals, smart phones, tablet personal computers (PCs), notebooks, personal digital assistants (PDAs), wearable devices, digital cameras, or the like are widely used.

Recently, a display device for securing a maximum screen in an electronic device having space limitations has been implemented and developed. For example, research and development on a full-screen display in which a display is extended to the bezel area formed at edges of an electronic device or to the periphery thereof are underway.

According to an embodiment, a display of an electronic device may be divided into a display area (or a viewing area) in which an image is displayed and a non-display area (or a non-viewing area) in which an image is not displayed. Electronic devices equipped with a full-screen display are implemented to minimize the non-display area or obviate the non-display area. Therefore, in an electronic device equipped with a full-screen display, at least one sensor (e.g., an infrared sensor, a proximity sensor, a camera sensor, or the like), which was previously provided in the non-display area (e.g., an upper area of the electronic device), may be provided (or disposed) in the display area. A display (e.g., a display panel) may have a sensor hole formed for at least one sensor.

DISCLOSURE OF INVENTION

Technical Problem

Electronic devices, including a full-screen display, are designed such that wires (or wiring circuits) related to display of images on the display bypass a sensor hole (or the periphery of a sensor hole), or are implemented based on a design in which the wires traverse (or cross) over the sensor hole. In the former design, wires may be clustered (or concentrated) around the sensor hole, which may lead to a large dead space (DS) (e.g., a black area). Accordingly, the image (or color) may be displayed to have a discontinuity in the sensor area of the display or in the vicinity thereof, which may not provide a smooth (or seamless) image. In the latter design, the wires, crossing in a transparent window area above the area in which the sensor is located, may degrade transparency. For example, the transparency may be reduced due to opaque wires in the transparent window area that is formed to improve the transmittance of the sensor.

Various embodiments disclose a display having at least one hole (e.g., a sensor hole) formed in a display area in which an image is displayed, and an electronic device including the same.

Various embodiments disclose a display in which a hole area in a display area is implemented to have a low resolution, and an electronic device including the same.

Various embodiments disclose a display having an improved pixel structure including a driving circuit for compensating for brightness in a low-resolution area, and an electronic device including the same.

Solution to Problem

An electronic device according to various embodiments of the disclosure may include a display including a display area having a plurality of pixels and a plurality of wires, and the display may include: a hole area encompassed by the display area; a plurality of first wires, among the plurality of wires, extending from a first side of the display area so as to be formed at a first interval and connected to the opposite side of the first side; second wires, among the plurality of wires, extending from a second side of the display area to the opposite side of the second side so as to be arranged at the first interval; and a plurality of third wires, among the plurality of wires, extending from the first side of the display area so as to be formed at a second interval greater than the first interval and bypassing the hole area so as to be connected to the opposite side of the first side.

An electronic device according to various embodiments of the disclosure may include a display including a display area having a plurality of pixels and a plurality of wires, and the display may include: a hole area encompassed by the display area; a plurality of first wires, among the plurality of wires, extending from a first side of the display area so as to be formed at a first interval and bypassing the hole area so as to be connected to the opposite side of the first side; second wires, among the plurality of wires, extending from a second side of the display area to the opposite side of the second side so as to be arranged at the first interval; and a plurality of third wires, among the plurality of wires, extending from the first side of the display area so as to be formed at a second interval greater than the first interval and connected to the opposite side of the second side through at least a portion of the hole area.

A display of an electronic device according to various embodiments of the disclosure may include: a display area having a plurality of pixels and a plurality of wires; a hole area encompassed by the display area; a first pixel electrically connected to a specified wire in a first portion of the display area and formed to have a first resolution; and a second pixel connected to the wire electrically connected to the first pixel in a second portion of the display area and formed to have a second resolution, wherein the second portion may include an area between the upper side of the hole area and an edge of the display in the display area, and wherein the second resolution may be less than the first resolution.

An electronic device according to various embodiments of the disclosure may include: a display including a display area having a plurality of pixels and a plurality of wires; and at least one sensor provided in the display area of the display, wherein the display may include at least one hole area in the display area through which the at least one sensor passes, wherein a first pixel may be formed in a first portion of the display area so as to have a first resolution, wherein a second pixel may be formed in a second portion of the display area so as to have a second resolution, wherein the second portion may include an area between the hole area and an edge of the display in the display area, and wherein the second resolution may be less than the first resolution.

Advantageous Effects of Invention

According to an electronic device according to various embodiments, in a display, having at least one hole (e.g., a sensor hole) formed in a display area in which an image is displayed, and an electronic device including the same, a lower resolution may be applied to a hole area of a display area, and the number of wires around the hole may be reduced, thereby reducing dead space (DS) and improving transparency. This makes it possible to implement seamless design of the display. According to various embodiments, it is possible to prevent degradation of brightness due to a reduction in the resolution of a corresponding area by improving a pixel structure when a low resolution is applied.

MODE FOR THE INVENTION

Figure 1:
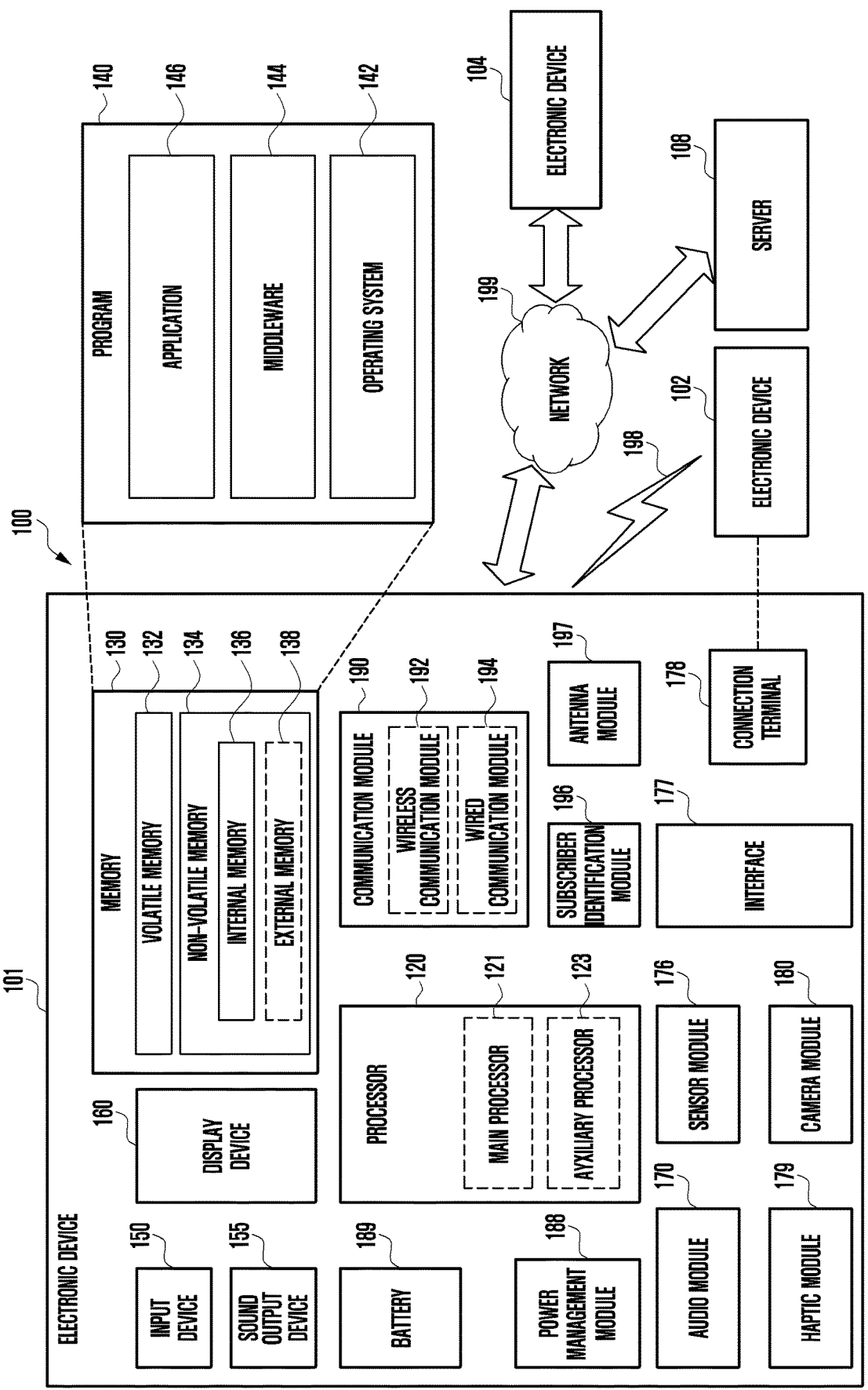
FIG. 1 is a block diagram of an electronic device, including a display having a plurality of wires bypassing a hole area encompassed by a display area, in a network environment according to various embodiments.

FIG. 1 is a block diagram of an electronic device 101, including a display having a plurality of wires bypassing a hole area encompassed by a display area, in a network environment 100 according to various embodiments.

Referring to FIG. 1, the electronic device 101 in the network environment 100 may communicate with an electronic device 102 via a first network 198 (e.g., a short-range wireless communication network), with an electronic device 104 or a server 108 via a second network 199 (e.g., a long-range wireless communication network), or with the electronic device 104 via the server 108, and may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. The processor 120 may load a command or data received from another component (e.g., the sensor module 176 or the communication module 190) in the volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101 and may include software (e.g., the program 140) and input data or output data for a command related thereto. The memory 130 may include the volatile memory 132 or the non-volatile memory 134.

The program 140 may be stored in the memory 130 as software, and may include an operating system (OS) 142, middleware 144, or an application 146.

The input device 150 may receive a command or data to be used by another component (e.g., the processor 120) of the electronic device 101, from the outside (e.g., a user) of the electronic device 101, and may include a microphone, a mouse, a keyboard, or a digital pen (e.g., a stylus pen).

The sound output device 155 may output sound signals to the outside of the electronic device 101 and may include a speaker or a receiver. The speaker may be used for general purposes, such as playing multimedia or playing record, and the receiver may be used for incoming calls and may be implemented as separate from, or as part of the speaker.

The display device 160 may visually provide information to the outside (e.g., a user) of the electronic device 101 and may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa, and may obtain the sound via the input device 150, or output the sound via the sound output device 155 or a headphone of an external electronic device (e.g., an electronic device 102) directly (e.g., over wires) or wirelessly coupled with the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state, and may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., over wires) or wirelessly, and may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102), and may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation, and may include a motor, a piezoelectric element, or an electric stimulator.

The camera module 180 may capture a still image or moving images and may include one or more lenses, image sensors, image signal processors, or flashes.

The power management module 188 may manage power supplied to the electronic device 101, and may be implemented as at least part of a power management integrated circuit (PMIC).

The battery 189 may supply power to at least one component of the electronic device 101, and may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., a LAN or a wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101 and may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. Another component (e.g., an RFIC) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101.

All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing, as at least part of a reply to the request. To that end, a cloud, distributed, or client-server computing technology may be used, for example.

Figure 2:
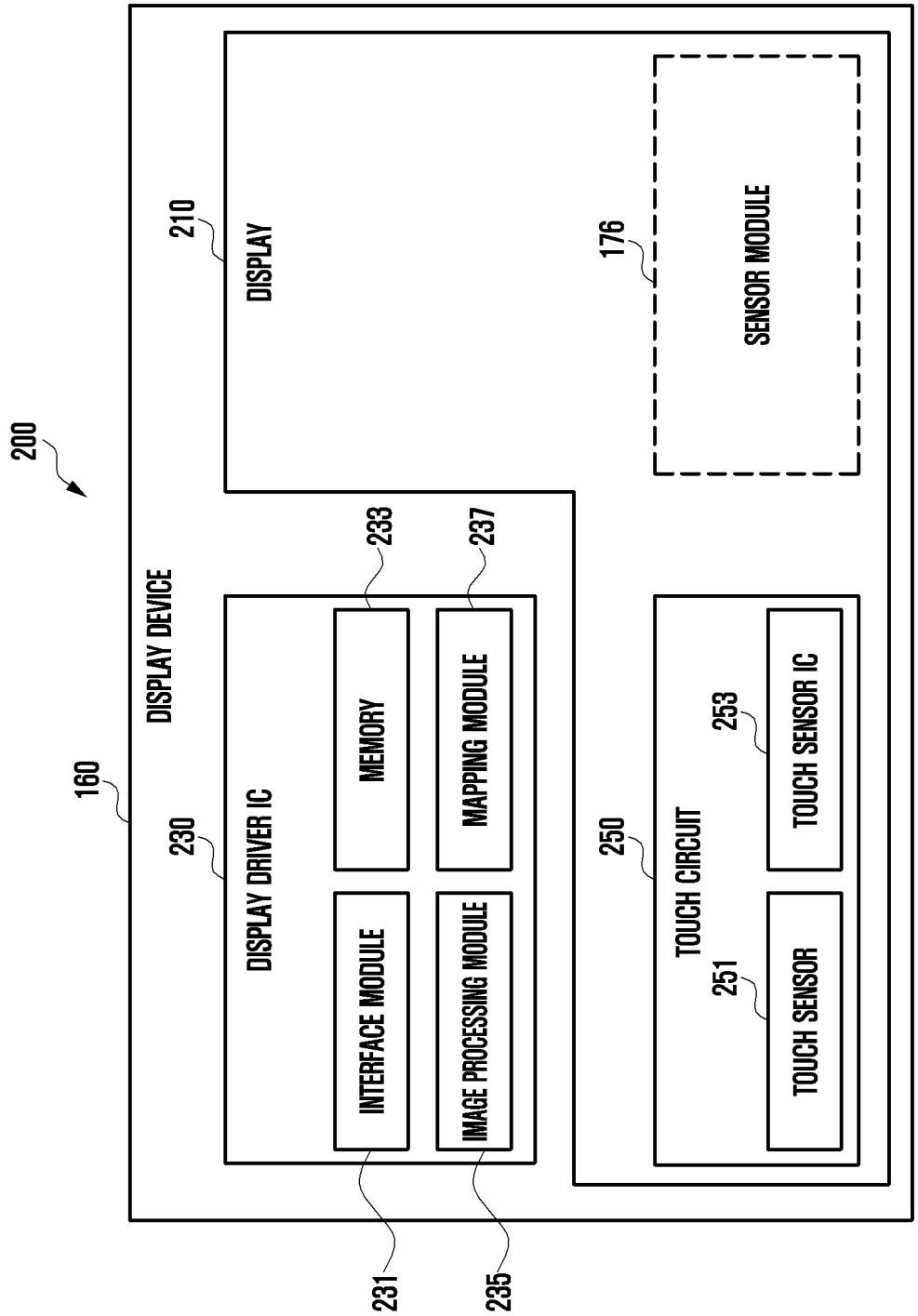
FIG. 2 is a block diagram of a display device including a plurality of wires bypassing a hole area encompassed by a display area according to various embodiments.

FIG. 2 is a block diagram 200 illustrating the display device 160 according to various embodiments.

Referring to FIG. 2, the display device 160 may include a display 210 and a display driver integrated circuit (DDI) 230 to control the display 210. The DDI 230 may include an interface module 231, memory 233 (e.g., buffer memory), an image processing module 235, or a mapping module 237.

The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 350 or the sensor module 176 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

The electronic device 101 according to embodiments may be one of various types of electronic devices, such as a portable communication device (e.g., a smartphone), a computer device, a portable multimedia device, a portable medical device, a camera, a wearable device, or a home appliance. However, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., over wires), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

A display device (e.g., the display device 200 in FIG. 2) according to various embodiments, which will be described below, may include, for example, a liquid crystal display (LCD), a field emission display (FED), a plasma display panel (PDP), an organic light-emitting diode (OLED) display, or the like. Among such flat panel displays, the OLED display displays an image (or a video) using an organic light-emitting diode that emits light by recombination of electrons and holes, and has the advantages of a quick response and low power consumption.

The organic light-emitting diode display may include a display panel including a plurality of pixels arranged in a matrix form, driving circuits that transmit an image data (e.g., RGB) signal to each of the plurality of pixels, thereby displaying an image, and the like. For example, the driving circuits may include a data driver for transmitting an image data signal through a data line (DL) connected to each pixel and a gate driver (or a scan driver) for transmitting a scan signal through a scan line (SL) connected to each pixel in order to activate each pixel to display an image according to the data signal. Hereinafter, although an organic light-emitting diode display is described by way of example in various embodiments, the disclosure is not limited thereto, and a driving circuit and a display improvement structure according to various embodiments may be used in various types of display devices.

Figure 3:
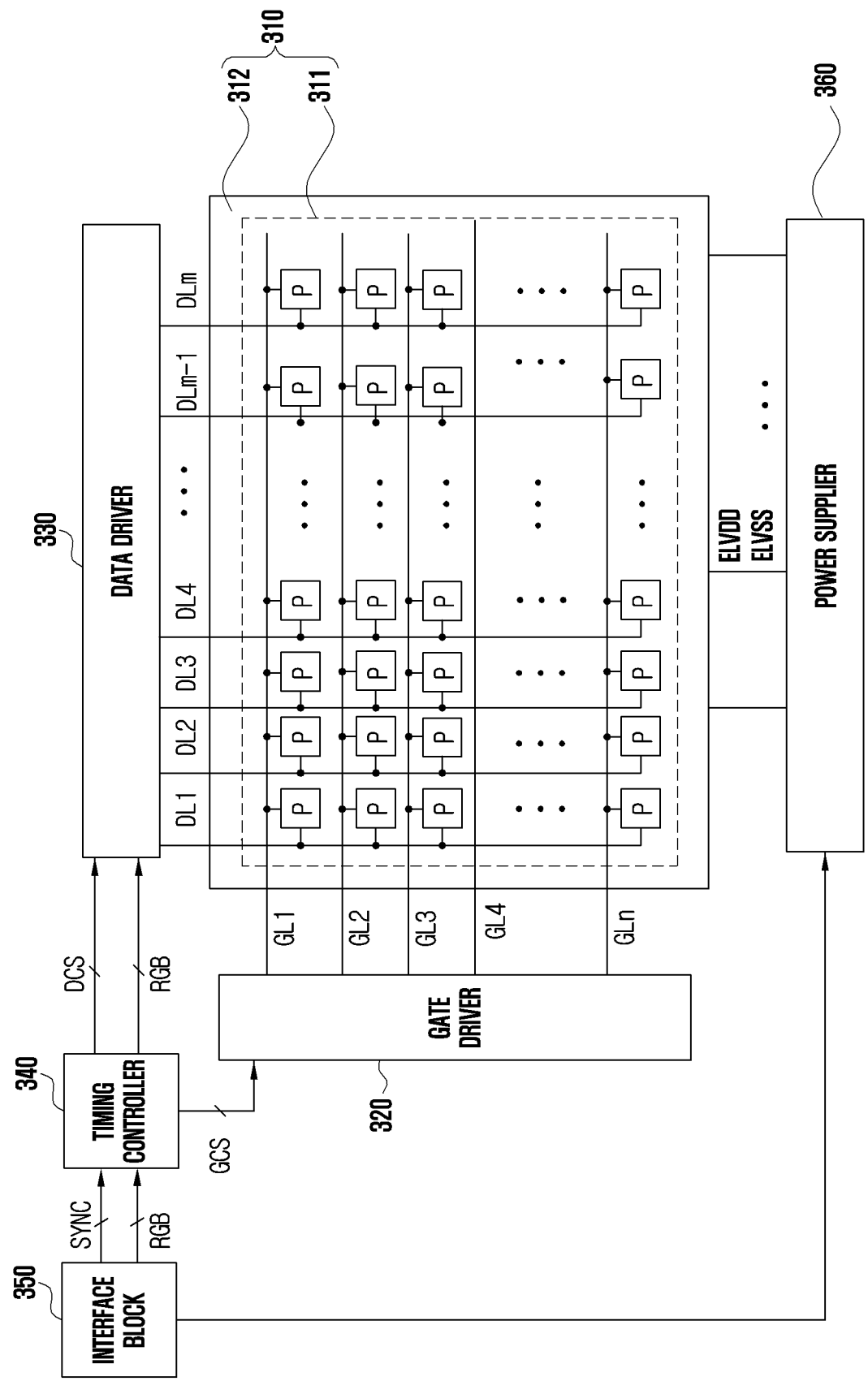
FIG. 3 is a diagram schematically illustrating a display and display drivers according to various embodiments.

FIG. 3 is a diagram schematically illustrating a display and display drivers according to various embodiments.

Referring to FIG. 3, a display 310 (e.g., the display 210 in FIG. 2) may include a display area (or a viewing area) 311 and a non-display area (or a non-viewing area) 312. According to an embodiment, the display 310 may include a plurality of pixels, and the pixels may include a plurality of subpixels P. The display 310 may include a plurality of gate lines GL (e.g., GL1 to GLn) and a plurality of data lines DL (e.g., DL1 to DLm), which cross each other. A subpixel P may be formed in the area in which the gate line GL and the data line DL cross each other. Each of the subpixels P may include an organic light-emitting diode (OLED) and at least one driving circuit for driving the organic light-emitting diode.

Display drivers (e.g., the display driver IC 230 in FIG. 2) for driving the display 310 may include a gate driver 320 (or a scan driver), a data driver 330, a timing controller 340, an interface block 350, and the like. According to various embodiments, the display area 311 may include a hole area (or a sensor hole area) in which at least one sensor (e.g., a camera sensor, a proximity sensor, an infrared sensor, etc.) is disposed. According to an embodiment, the hole area encompassed by the display area 311 may be formed in a shape corresponding to the shape (e.g., the form and size) of each sensor such that a corresponding sensor passes therethrough. The hole area according to various embodiments will be illustrated in the drawings to be described later.

The driving circuit provided in each subpixel P may include at least one switch (e.g., a thin-film transistor (TFT)) (hereinafter referred to as a "thin-film transistor"), at least one capacitor (e.g., a storage capacitor (CST)), a light-emitting element (e.g., an organic light-emitting diode), and the like.

At least one thin-film transistor (TFT) may charge the capacitor with a data voltage supplied from the data line DL in response to a scan signal supplied from the gate line GL. At least one thin-film transistor (TFT) may control the amount of current supplied to the organic light-emitting diode according to the data voltage charged in the capacitor.

The gate driver 320 may supply scan signals (or scan pulses) to a plurality of gate lines GL1 to GLn according to at least one gate control signal GCS provided from the timing controller 340. The gate driver 320 may include a gate shift register that outputs scan signals. The scan signals may be sequentially supplied to the respective pixels, and a single scan signal or a plurality of scan signals may be provided. In the case where a plurality of scan signals is provided, the gate lines GL may include a plurality of lines for supplying the plurality of scan signals to the respective pixels. For example, the gate driver 320 may be connected to column lines, which are cathode terminals of the display 310, and may perform an operation of sequentially selecting corresponding column lines.

The data driver 330 may convert image data RGB provided from the timing controller 340 into a data voltage according to at least one data control signal DCS provided from the timing controller 340. The data driver 330 may generate data voltages using a plurality of gamma compensation voltages. The data driver 330 may sequentially supply the generated data voltages to a plurality of pixels in units of lines (or rows). The data driver 330 may include a data shift register for outputting a sampling signal, a latch circuit for latching image data RGB for each line in response to the sampling signal, a digital analog converter (DAC) for converting the latched image data into an analog gray voltage (e.g., a pixel voltage), and the like.

The timing controller 340 may sort the image data RGB provided from the interface block 350 according to the size and resolution of the display 310. The timing controller 340 may supply the sorted image data RGB to the data driver 330. The timing controller 340 may transmit a plurality of control signals (e.g., GCS and DCS) using at least one synchronization signal SYNC provided from the interface block 350. The plurality of control signals (e.g., GCS and DCS) may include at least one gate control signal GCS and at least one data control signal DCS. The gate control signal GCS may be a signal for controlling the driving timing of the gate driver 320. The data control signal DCS may be a signal for controlling the driving timing of the data driver 330. The synchronization signals SYNC may include a dot clock (DCLK), a data enable signal (DE), a horizontal synchronization signal (Hsync), a vertical synchronization signal (Vsync), or the like.

According to an embodiment, the interface block 350 may receive image data RGB from a processor (e.g., the processor 120 in FIG. 1), and may transmit the received image data RGB to the timing controller 340. The interface block 350 may generate at least one synchronization signal SYNC, and may transmit the same to the timing controller 340. The interface block 350 may control a power supplier 360 (e.g., the power management module 188 in FIG. 1) to supply at least one driving voltage (e.g., ELVDD, ELVSS, etc.) to the display 310.

According to an embodiment, the power supplier 360 may generate at least one driving voltage (e.g., ELVDD or ELVSS) necessary for driving the display 310, and may supply the generated driving voltage to the display 310. According to an embodiment, a single power supplier 360 or a plurality of power suppliers 360 may be configured to independently supply at least one driving voltage to an area in which at least one sensor is disposed (e.g., at least a portion of the display area 311). At least one driving voltage may include, for example, ELVDD, ELVSS, a gate-on voltage, a gate-off voltage, an initialization voltage, or the like. According to an embodiment, the gate-on voltage may be a voltage for turning on at least one thin-film transistor (TFT) provided in the display 310. The gate-off voltage may be a voltage for turning off at least one thin-film transistor (TFT) provided in the display 310. The initialization voltage may be a voltage for initializing at least one node provided in the driving circuit for driving at least one subpixel P among the plurality of subpixels P.

Figure 4:
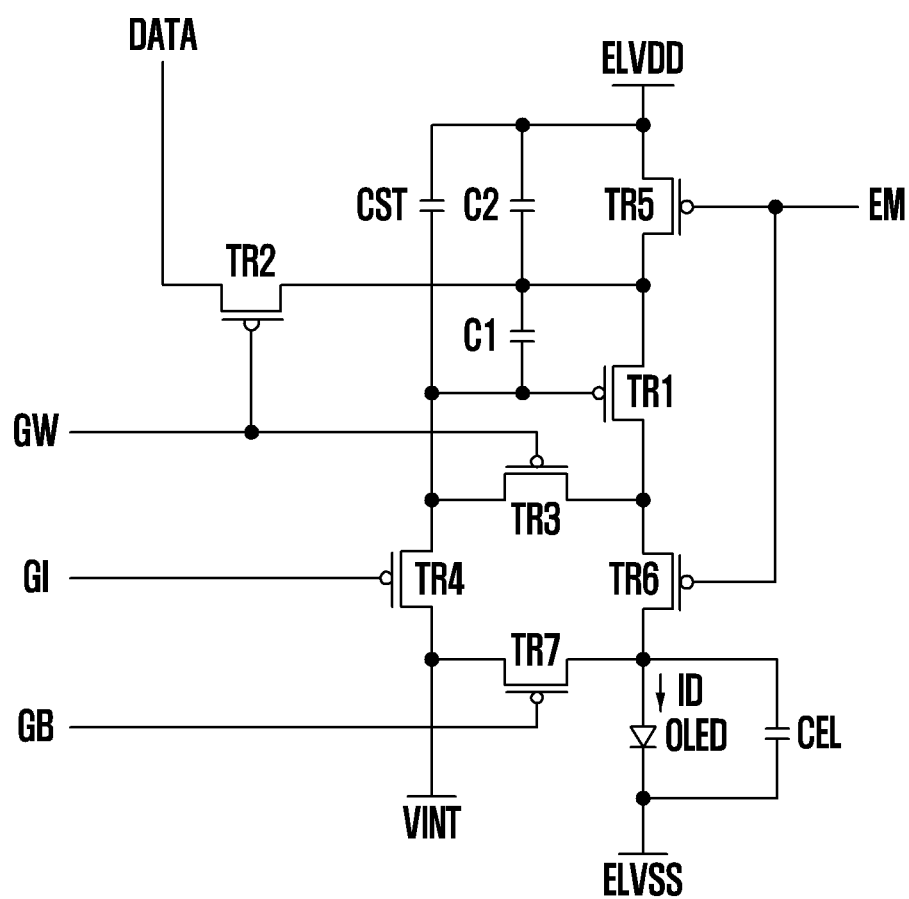
FIG. 4 is a diagram illustrating a driving circuit of a display according to various embodiments.

FIG. 4 is a diagram illustrating a driving circuit of a display according to various embodiments.

According to various embodiments, each pixel (or a subpixel P) of the display 310 may be configured, for example, as shown in FIG. 4. FIG. 4 may show an example of a single pixel among all pixels formed in the display 310.

Referring to FIG. 4, a driving circuit for driving at least one subpixel P among a plurality of subpixels (e.g., the subpixels P in FIG. 3) may include, for example, M (e.g., 7) thin-film transistors TR1 to TR7, a capacitor CST, a light-emitting element (or an organic material) (e.g., an organic light-emitting diode (OLED)) that emits light, and the like. According to an embodiment, the subpixel may further include a response speed improvement capacitor C1, a source connection capacitor C2, a diode parallel capacitor CEL, and the like. According to an embodiment, the organic light-emitting diode OLED may emit light, based on a driving current ID. The organic light-emitting diode OLED may include a first terminal and a second terminal According to an embodiment, the second terminal of the organic light-emitting diode OLED may receive a specific power voltage (e.g., ELVSS). In an embodiment, the first terminal of the organic light-emitting diode (OLED) may be an anode terminal, and the second terminal thereof may be a cathode terminal. In another embodiment, the first terminal of the organic light-emitting diode may be a cathode terminal, and the second terminal thereof may be an anode terminal.

The driving circuit shown in FIG. 4 is intended to improve process variation of the thin-film transistors TR1 to TR7 and the response speed of a pixel, and may be changed or modified in various ways. The driving circuit shown in FIG. 4 is disclosed in Korean Patent Publication No. 10-2016-0024191, so a detailed description of the driving method thereof will be omitted. The pixel structure of the disclosure is not limited to the example shown in FIG. 4, and may be variously modified or changed.

Figure 5:
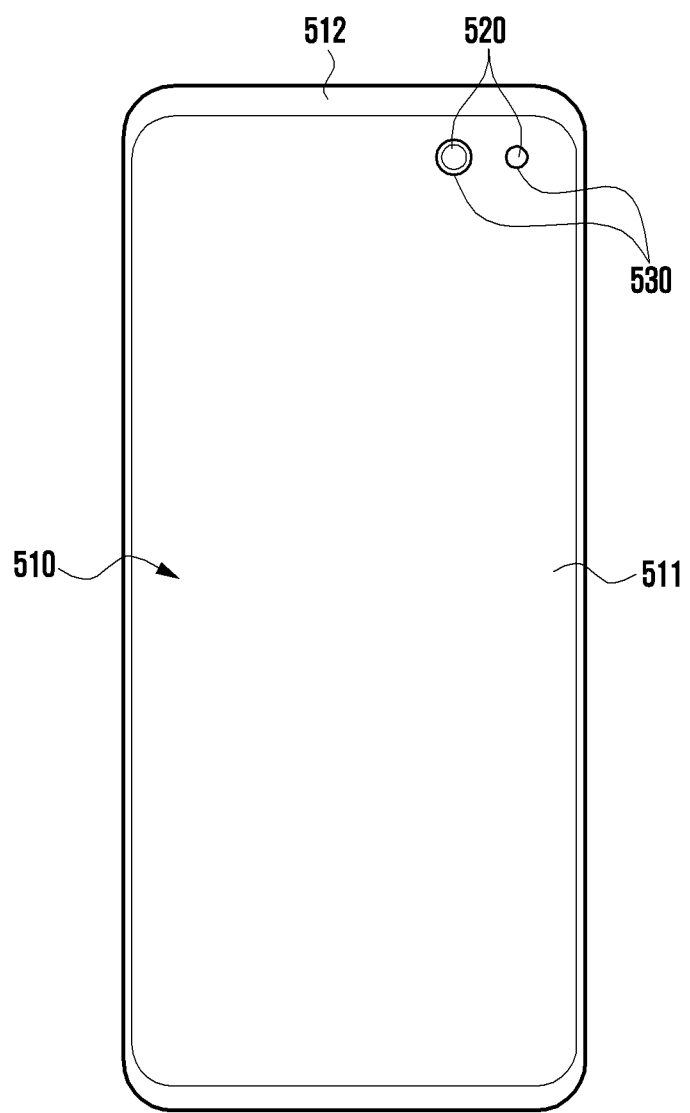
FIG. 5 is a diagram illustrating an example of the front of an electronic device equipped with a display according to various embodiments.

FIG. 5 is a diagram illustrating an example of the front of an electronic device equipped with a display according to various embodiments.

As shown in FIG. 5, in the electronic device 101 according to various embodiments, a front display 510 (e.g., the display 210 in FIG. 2 or the display 310 in FIG. 3) may be implemented as a full-screen display. For example, the display 510 of the electronic device 101 may extend to a bezel, which is formed on the borders (or edges) of the electronic device 101, or to the periphery thereof.

According to an embodiment, the display 510 may include a display area 511 (e.g., the display area 311 in FIG. 3) and a non-display area 512 (e.g., the non-display area 312 in FIG. 3). According to various embodiments, the display area 511 of the display 510 may include a plurality of pixels and a plurality of wires (e.g., data lines DL and gate lines GL), and the pixels may include a plurality of subpixels P. For example, the display 510 may be configured as a display panel including a plurality of pixels arranged in a matrix form and a driving circuit for transmitting an image data (e.g., RGB) signal to each of the plurality of pixels so as to display an image. The driving circuit may include, for example, a data driver that transmits an image data signal through a data line DL connected to each pixel and a gate driver (or a scan driver) that transmits a scan signal through a gate line GL connected to each pixel in order to activate each pixel to display an image according to the data signal.

According to various embodiments, the display 510 may have at least one sensor hole 530 (or a hole area 530) formed in at least a portion thereof for at least one sensor 520 (or through which at least one sensor 520 passes) and at least one sensor 520 through the sensor hole 530. According to an embodiment, the sensor hole 530 may be formed to be encompassed by the display area 511 (e.g., the display area 311 in FIG. 3) of the display 510, and may be formed in a shape corresponding to the shape (e.g., form and size) of each sensor 520 such that a corresponding sensor passes therethrough. In an embodiment, at least a portion may include, for example, at least a portion on the upper side of the display area 511 (e.g., the display area 311 in FIG. 3) of the display 510. According to an embodiment, the sensor hole 530 may be formed in a layer (e.g., a display panel) under a glass layer of the display 510.

According to an embodiment, the display 510 having the sensor hole 530 formed in the display area 511 is implemented based on a design in which data lines DL (or wires) related to display of images bypass the sensor hole 530 (or the periphery of the sensor hole 530) (hereinafter referred to as a "first design scheme") or a design in which the data lines DL (or wires) traverse (or cross) over the sensor hole 530 (e.g., the design in the case where a window above the sensor is configured as a transparent window in order to improve the transmittance of the sensor) (hereinafter referred to as a "second design scheme"). These examples are shown in FIGS. 6A and 6B.

Figure 6A:
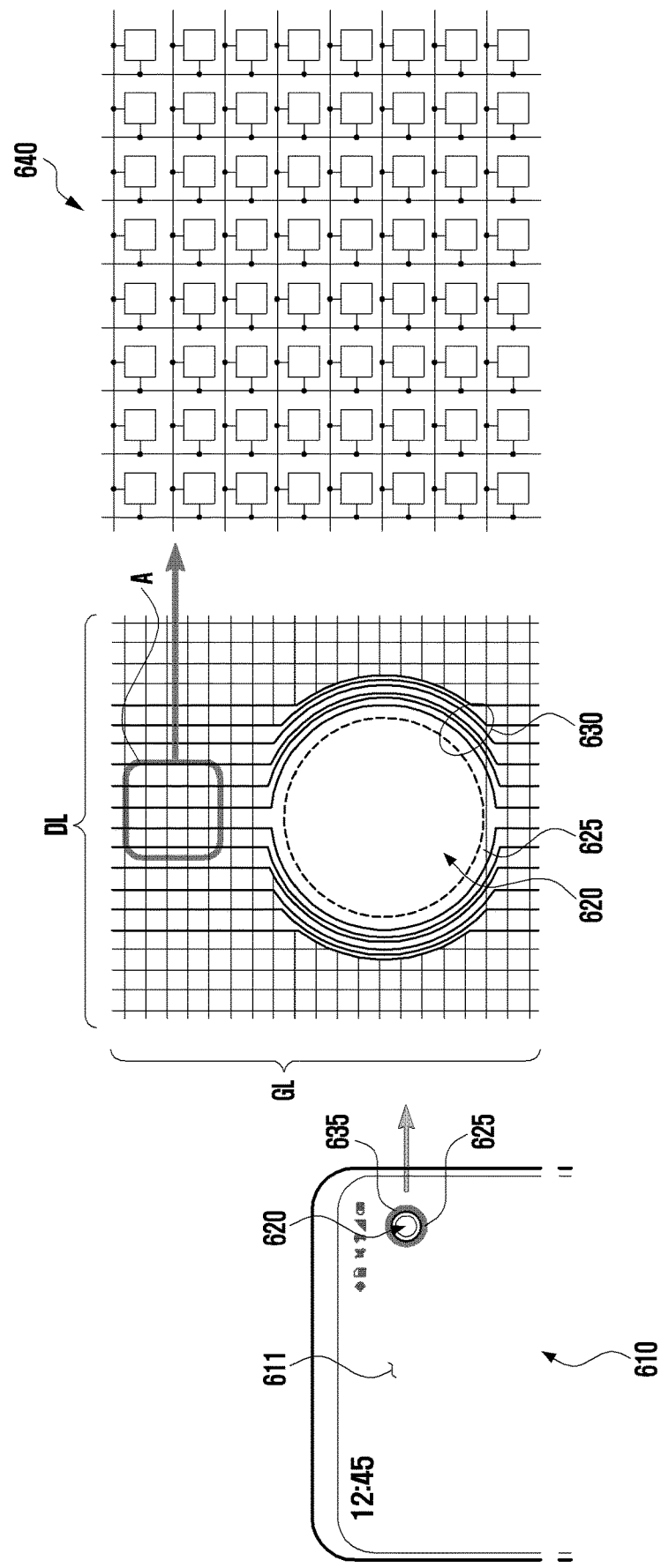
FIGS. 6A and 6B are diagrams illustrating examples of a wiring structure with respect to a sensor hole in a display.
Figure 6B:
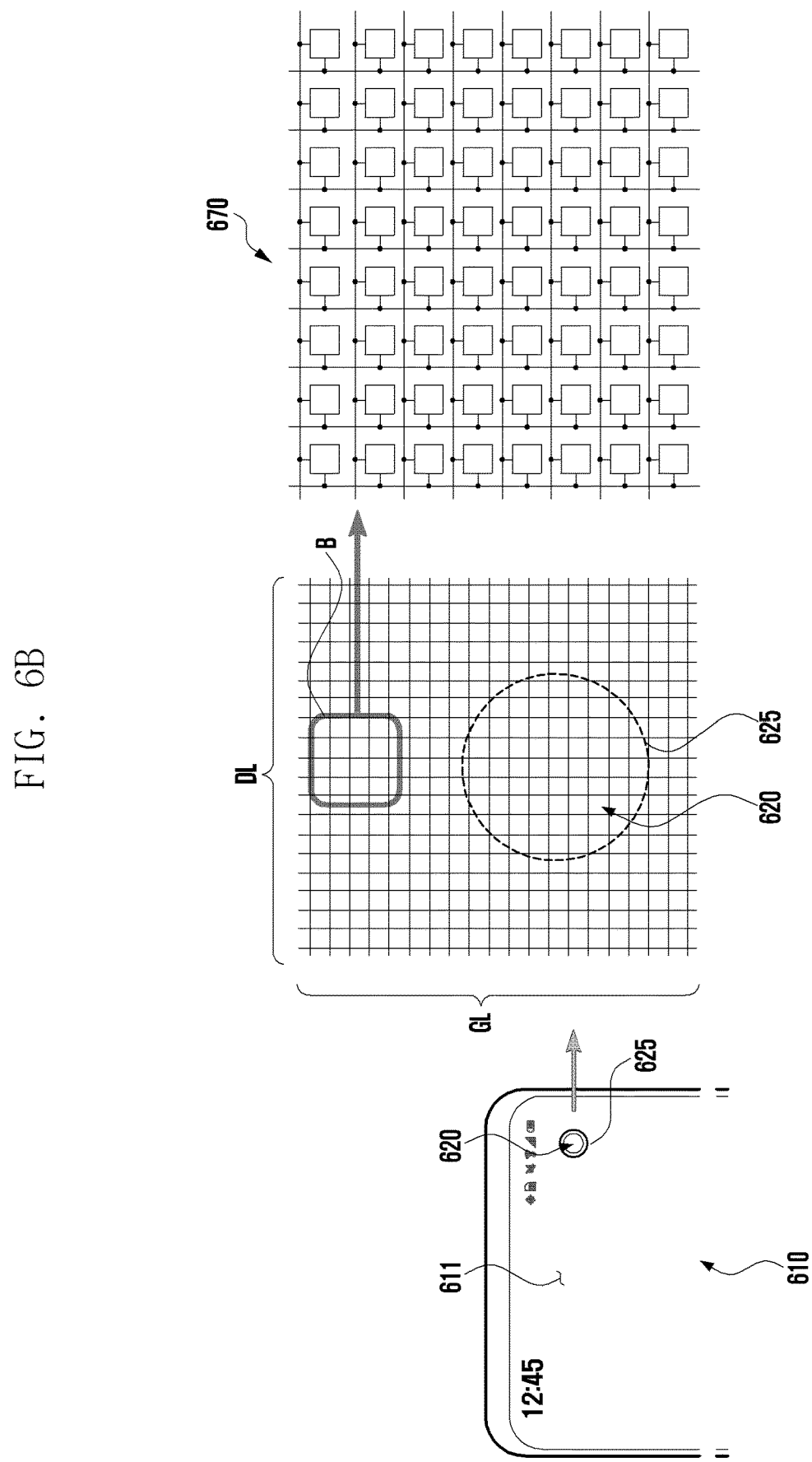

FIGS. 6A and 6B are diagrams illustrating examples of a wiring structure with respect to a sensor hole in a display of an electronic device.

Referring to FIG. 6A, FIG. 6A may show an example of a first design scheme. According to an embodiment, in the case of the first design scheme, as shown in FIG. 6A, data lines DL (or wires) that bypass the sensor hole 625 for the sensor 620 (e.g., the hole area 625 encompassed by the display area 611 of the display 610) (e.g., the sensor hole 530 in FIG. 5) may be densely formed (or concentrated) on the periphery of the sensor hole 625, and a dead space (DS) (e.g., a black area around the sensor hole 625, which is indicated by an element 635 in FIG. 6A) may extend in proportion to the density (or concentration) of the data lines DL 630 bypassing the sensor hole 625. This may cause a discontinuity of an image (or color) in the area of the sensor 620 (or the hole area) or on the periphery thereof in the display 610, so that a smooth (or seamless) image may not be provided.

Referring to FIG. 6B, FIG. 6B may show an example of a second design scheme. According to an embodiment, in the case of the second design scheme, as shown in FIG. 6B, the window above the sensor hole 625 (or the hole area) may be configured as a transparent window in the display area 611 of the display 610. According to an embodiment, wires (e.g., data lines DL and gate lines GL) that cross each other in the transparent window area above the sensor 620 (e.g., the transparent window area above the sensor hole 625 (or the hole area)) may degrade the transparency of the transparent window. For example, the opaque wires may degrade the transparency of the transparent window area that is formed to improve transmittance by the sensor 620.

In the examples shown in FIGS. 6A and 6B, an element 640 and an element 670 indicate examples of a part of an upper area (e.g., an area A in FIG. 6A and an area B in FIG. 6B) of the sensor 620 (or the hole area (e.g., the sensor hole 625)) in the display area 611 of the display 610. For example, the element 640 and the element 670 may indicate examples of some of the pixels (or subpixels) formed between the sensor 620 (or the sensor hole 625) and the upper edge of the display 610 (or the upper bezel adjacent to the position of the sensor 610). As shown in the drawings, the upper area (e.g., the area A in FIG. 6A or the area B in FIG. 6B) may be formed of a plurality of subpixels. For example, a group using at least one of one or more red subpixels, one or more green subpixels, or one or more blue subpixels may be repeatedly formed (e.g., RGB, RG, or BG). The design of subpixels may be variously configured depending on subpixel rendering (SPR).

Various embodiments may be intended to solve the above-described problems resulting from the first design scheme of wires and the second design scheme of wires. In various embodiments, in relation to at least one sensor 620 (e.g., the sensor 520 in FIG. 5) provided in the display area 611 (e.g., the display area 511 in FIG. 5) of the display 610 (e.g., the display 510 in FIG. 5), the electronic device 101 may be implemented to include both the wires of the first design scheme and the wires of the second design scheme for each sensor depending on the type of sensor. Hereinafter, a pixel improvement structure capable of reducing the number of wires in the hole area by applying a resolution below a predetermined range (e.g., a resolution relatively lower than the resolution of other areas in the display area 611) to the hole area (e.g., the sensor hole 530 in FIG. 5) (or in order to reduce the resolution to a predetermined value), when designing the wires according to the first design scheme shown in FIG. 6A and the wires according to the second design scheme shown in FIG. 6B, and compensating for deterioration of brightness due to a reduction in resolution in the area to which a resolution below a predetermined range is applied (e.g., a low-resolution area) will be described.

Figure 7A:
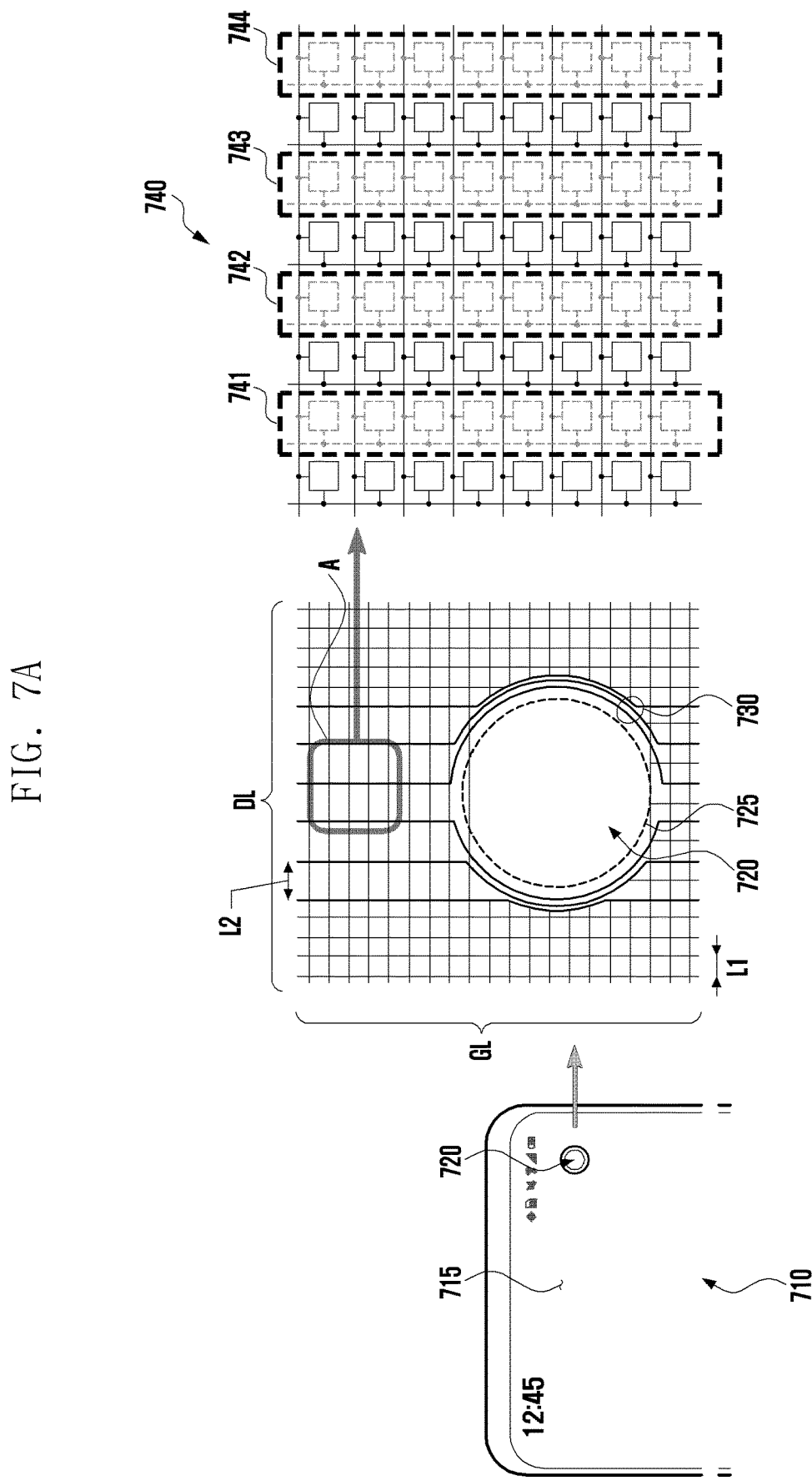
FIGS. 7A and 7B are diagrams illustrating examples of a wiring structure with respect to a sensor hole in a display according to various embodiments.
Figure 7B:
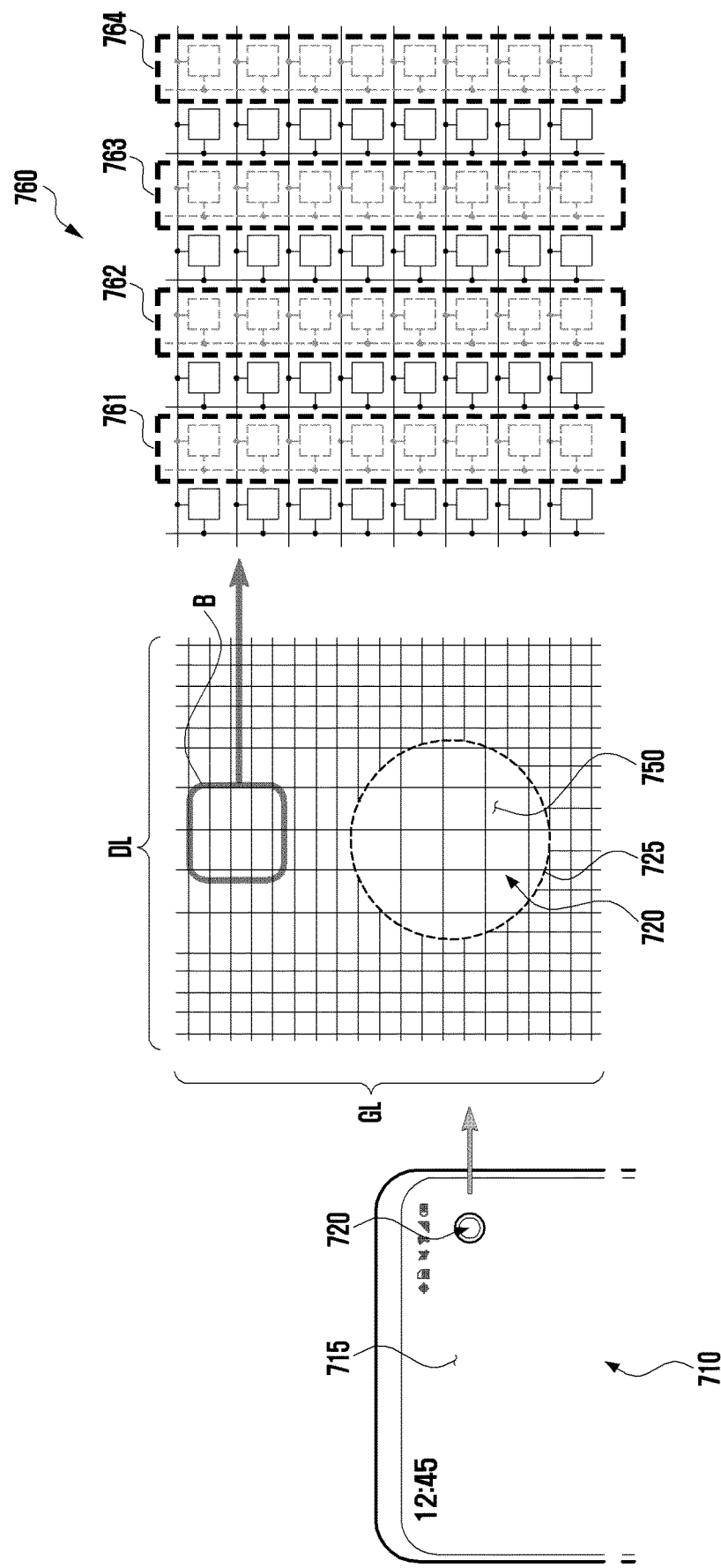

FIGS. 7A and 7B are diagrams illustrating examples of a wiring structure with respect to a sensor hole in a display according to various embodiments.

According to various embodiments, a display 710 (e.g., the display 210 in FIG. 2 or the display 310 in FIG. 3) may include a display area 715 (e.g., the display area 311 in FIG. 3 or the display area 511 in FIG. 5) including a plurality of pixels and a plurality of wires (e.g., data lines DL and gate lines GL). According to various embodiments, the display 710 may include at least one sensor hole 725 for at least one sensor 720 in at least a portion of the display area 715. According to an embodiment, at least one sensor hole 725 may be encompassed by the display area 715.

Referring to FIG. 7A, FIG. 7A may show an example in which wires for a low resolution are designed to occupy at least a portion of the display area 715 in the case where the wires are formed (or arranged) according to the first design scheme in relation to the area of the sensor hole 725 (or the hole area), thereby reducing the number of wires around the sensor hole 725 and reducing dead space (DS) around the sensor hole 725 according thereto. According to an embodiment, at least a portion to which a low resolution is applied may include an area (e.g., an area A) between the sensor hole 725 (or the sensor 720) and the edge of the display 710 (or the bezel adjacent to the position of the sensor 720).

According to an embodiment, a plurality of wires constituting the display area 715 may include, for example, a plurality of first wires (e.g., data lines DL) and a plurality of second wires (e.g., gate lines GL). According to an embodiment, the wires remaining after removing at least some of the first wires from the area A, among the plurality of wires, may be referred to as "third wires".

For example, the display area 715 may include a plurality of first wires, among the plurality of wires, which are at least some of the data lines DL that extend from a first side (or a vertical side) of the display area 715 (e.g., the area where a data driver of the display 710 is located, for example, the lower edge area of the display 710) so as to be formed (arranged) at a first interval L 1 (or distance or density) and are connected to the opposite side of the first side (e.g., an upper edge area of the display area 715). For example, the display area 715 may include a plurality of second wires, among the plurality of wires, which are at least some of the gate lines GL that extend from at least one second side (or a horizontal side) of the display area 715 (e.g., the area in which the gate driver of the display 710 is located (e.g., a left edge area when viewing the front of the electronic device 101)) to the opposite side of the second side (e.g., a right edge area of the display area 715) so as to be arranged at the first interval. According to various embodiments, the gate driver, for example, may be provided both in the left edge area and in the right edge area when viewing the front of the electronic device 101 shown in FIG. 5.

According to various embodiments, the display area 715 may include a plurality of third wires, among the plurality of wires, which are some other data lines DL that extend from the first side of the display area 715 so as to be formed at a second interval L2 greater than the first interval in the upper area (e.g., the area A) of the area of the sensor hole 725 and bypass the area of the sensor hole 725 so as to be connected to the opposite side of the first side. According to an embodiment, the interval between the wires in the area in which the wires bypass the area of the sensor hole 725 may be, for example, a third interval, which is smaller than the first interval. According to various embodiments, for example, the parts of the plurality of third wires, which range from the lower side of the area of the sensor hole 725 to the area in which the wires bypass the area of the sensor hole 725, may belong to the first wires. At least some of the first wires may be removed (e.g., cut) from the bypassing area, and some other wires of the first wires, which are not removed, may bypass the area of the sensor hole 725, and may extend to the upper area of the area of the sensor hole 725 (e.g., the opposite side of the first side) (e.g., the upper edge area of the display area 715) at a second interval.

Referring to FIG. 7B, FIG. 7B may show an example in which wires for a low resolution are designed to occupy a transparent window area 750 above the sensor hole 725 in the case where the wires are formed (or arranged) in the second design scheme in relation to the area of the sensor hole 725 (or the hole area), thereby reducing the number of wires appearing in the transparent window area 750 and improving the transparency of the transparent window area 750 according thereto. According to an embodiment, the transparent window area 750 may indicate the area above the sensor 720.

According to an embodiment, a plurality of wires constituting the display area 715 may include, for example, a plurality of first wires (e.g., data lines DL) and a plurality of second wires (e.g., gate Lines GL). According to an embodiment, the wires remaining after removing at least some of the first wires from the area B, among the plurality of wires, may be referred to as "third wires". According to an embodiment, the wires remaining after removing at least some of the second wires from the transparent window area 750, among the plurality of wires, may be referred to as "fourth wires".

For example, the display area 715 may include a plurality of first wires, among the plurality of wires, which are at least some of the data lines DL that extend from a first side (or a vertical side) of the display area 715 (e.g., the area where a data driver of the display 710 is located, for example, the lower edge area of the display 710) so as to be formed (arranged) at a first interval L1 (or distance or density) and bypass the area of the sensor hole 725 so as to be connected to the opposite side of the first side (e.g., an upper edge area of the display area 715). For example, the display area 715 may include a plurality of second wires, among the plurality of wires, which are at least some of the gate lines GL extending from at least one second side (or a horizontal side) of the display area 715 (e.g., the area in which the gate driver of the display 710 is located (e.g., a left edge area when viewing the front of the electronic device 101)) to the opposite side of the second side (e.g., a right edge area of the display area 715) so as to be arranged at a first interval.

According to various embodiments, the display area 715 may include a plurality of third wires, among the plurality of wires, which are some other data lines DL that extend from the first side of the display area 715 so as to be formed at a second interval L2, which is greater than the first interval, in the upper area (e.g., the area B) of the area of the sensor hole 725 and are connected to the opposite side of the first side through at least a portion of the area of the sensor hole 725 (e.g., the transparent window area 750).

According to various embodiments, the plurality of third wires may include some other data lines connected from one side (e.g., the first side) to the opposite side (e.g., the opposite side of the first side) through at least a portion of the area of the sensor hole 725 (e.g., the transparent window area 750). For example, the data lines formed (arranged) in the transparent window area 750 and the data lines DL formed (arranged) in the area B may be wires formed at the same second interval. According to various embodiments, for example, the parts of the plurality of third wires that range from the lower side of the area of the sensor hole 725 (e.g., the transparent window area 750) to the area of the sensor hole 725 may belong to the first wires. At least some of the first wires may be removed (e.g., cut) from the area in which the wires cross the area of the sensor hole 725, and some other wires of the first wires, which are not removed, may cross the area of the sensor hole 725 from the area of the sensor hole 725 at a second interval, and may extend to the upper area of the area of the sensor hole 725 (e.g., the opposite side of the first side) (e.g., the upper edge area of the display area 715).

According to various embodiments, the display area 715 may include a plurality of fourth wires, among the plurality of wires, which are some other gate lines GL that extend from the second side of the display area 715 so as to be formed at a second interval L2, which is greater than the first interval, in the transparent window area 750 corresponding to the portion above the area of the sensor hole 725 and are connected to the opposite side of the second side through at least a portion of the area of the sensor hole 725 (e.g., the transparent window area 750). According to various embodiments, for example, the parts of the plurality of fourth wires that range from the left side of the area of the sensor hole 725 (e.g., the transparent window area 750) to the area of the sensor hole 725 and the parts thereof that range from the right side of the area of the sensor hole 725 to the right edge area of the display area 715 may belong to the second wires. At least some of the second wires may be removed (e.g., cut) from the area in which the wires cross the area of the sensor hole 725, and some other wires of the second wires, which are not removed, may cross the area of the sensor hole 725 at a second interval from the area of the sensor hole 725, and may extend to the right area of the area of the sensor hole 725 (e.g., the opposite side of the second side) (e.g., the right edge area of the display area 715).

According to various embodiments, in FIG. 7B, the third wires and the fourth wires, intersecting each other, may appear in the area above the area of the sensor hole 725 (e.g., the transparent window area 750), and subpixels electrically connected to the corresponding wires may not be included therein. For example, wires may be formed (or arranged) in the transparent window area 750, and subpixels may be removed therefrom.

In the examples shown in FIGS. 7A and 7B, an element 740 and an element 760 may indicate examples of some pixels (or subpixels) formed in an upper area of the area of the sensor hole 725 (e.g., an area A in FIG. 7A and an area B in FIG. 7B) (e.g., an area between the sensor 720 (or the sensor hole 725) and the edge of the display 710 (or the bezel adjacent to the position of the sensor 720)).

As shown in the drawings, the upper area (e.g., the area A in FIG. 7A or the area B in FIG. 7B) may be formed of a plurality of subpixels. For example, a group of red subpixels, green subpixels, or blue subpixels may be repeatedly formed. According to various embodiments, compared with the arrangement of the subpixels shown in FIGS. 6A and 6B, for example, at least some of the subpixels may be removed from the upper area (e.g., the area A in FIG. 7A or the area B in FIG. 7B) in FIGS. 7A and 7B. For example, the subpixels to be removed may be removed so as to correspond to the wires (e.g., the data lines DL) that are removed (or cut) from the upper area (e.g., the area A in FIG. 7A or the area B in FIG. 7B). For example, FIGS. 7A and 7B may show examples in which the second column 741 or 761, the fourth column 742 or 762, the sixth column 743 or 763, and the eighth column 744 or 764 are removed from the drawings.

According to various embodiments, at least some wires may be removed (or cut) from the upper area (e.g., the area A in FIG. 7A or the area B in FIG. 7B) in order to apply a low resolution thereto, and subpixels corresponding to the removed wires may be removed. For example, the data lines DL in FIGS. 7A and 7B, which are not removed, may correspond to a plurality of third wires, and the subpixels in the area A in FIG. 7A and the area B in FIG. 7B may be formed (or arranged) to include a driving circuit for driving the corresponding subpixels, based on the plurality of third wires.

In various embodiments, pixels may be formed (or arranged) to have a lower resolution in the area between the area of the sensor hole 720 and the edge of the display 710 (e.g., the area A in FIG. 7A or the area B in FIG. 7B) than in other areas of the display area 715. In various embodiments, at least some wires and at least some pixels, which are to be removed, may be removed within a range in which problems with display of an image do not occur, based on rendering of the subpixels. For example, design may be performed in consideration of color division based on a red subpixel, a blue subpixel, and a green subpixel. According to an embodiment, fewer repeating groups of subpixels may be formed than those of basic subpixels.

In various embodiments, as shown in FIG. 7A or 7B, a seamless image may be produced or transparency may be improved by applying a low resolution to at least a portion of the display area. In this case, the brightness may be lowered somewhat due to a reduction in the number of pixels in the area of the display area to which a resolution below a specified range (e.g., a low resolution) is applied. Accordingly, in various embodiments, a driving circuit may be provided in a portion to which a resolution below a specified range (e.g., a low resolution) is applied in order to compensate for deterioration of brightness. Hereinafter, a pixel design for compensating for deterioration of brightness according to various embodiments will be described.

Figure 8A:
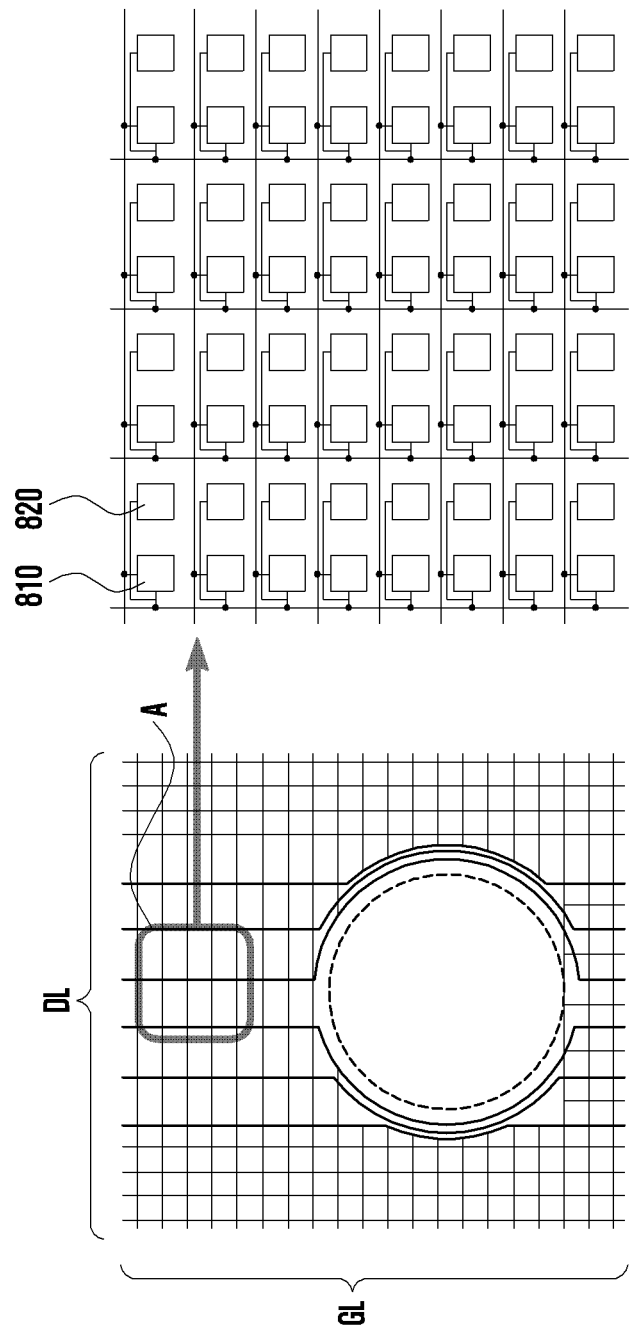
FIGS. 8A and 8B are diagrams illustrating examples of a pixel structure of a display according to various embodiments.
Figure 8B:
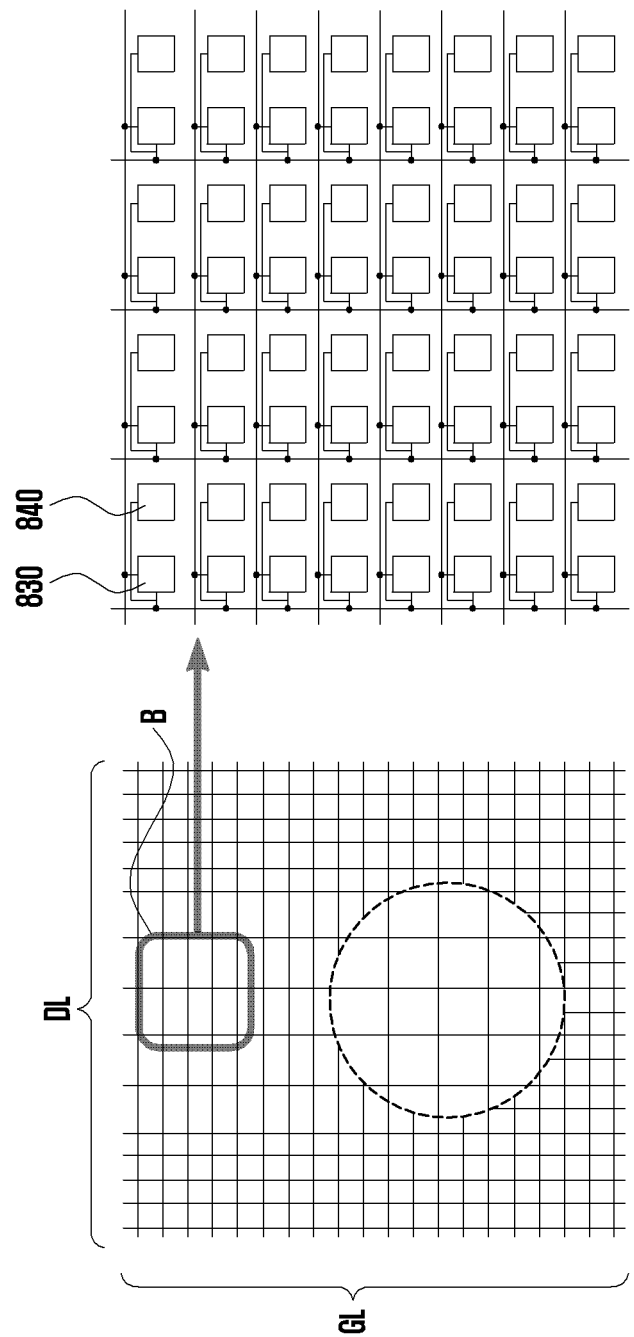

FIGS. 8A and 8B are diagrams illustrating examples of a pixel structure of a display according to various embodiments.

According to various embodiments, FIGS. 8A and 8B may show examples of a pixel structure for compensating for deterioration of brightness in an area having a resolution below a specified range (e.g., an area A in FIG. 8A or an area B in FIG. 8B) (hereinafter referred to as a "low-resolution area") in the case where wires are formed (or arranged) in the first design scheme (e.g., the example shown in FIG. 7A) or in the case where wires are formed (or arranged) in the second design scheme (e.g., the example shown in FIG. 7B).

Referring to FIGS. 8A and 8B, in various embodiments, a driving circuit (e.g., a driving circuit 820 or a driving circuit 840) (hereinafter referred to as a "compensation driving circuit (or dummy driving circuit)") for each pixel (e.g., a pixel 810 or a pixel 830) may be further included in the low-resolution area (e.g., the area A or the area B). For example, in the case of the pixel 810 or 830, a driving circuit for driving the pixel (hereinafter referred to as a "basic driving circuit") is included as shown in FIG. 4 described above, and in various embodiments, a compensation driving circuit 820 or 840 for compensating for brightness may be further provided in addition to the basic driving circuit.

According to various embodiments, a plurality of pixels formed in the display area may include a plurality of first pixels formed in the normal area and a plurality of second pixels formed in the low-resolution area (e.g., the area A or the area B) and having a structure different from that of the first pixel. According to an embodiment, the plurality of pixels may have a structure including, for example, a plurality of first pixels electrically connected to a plurality of first wires and a plurality of second wires, and a plurality of second pixels electrically connected to a plurality of second wires and a plurality of third wires. In various embodiments, the compensation driving circuit 820 or 840 may be electrically connected to the basic driving circuit, and may be formed for each pixel so as to be included in the pixel 810 or 830, or may be formed (or arranged) independently of the pixel 810 or 830. An example of driving circuits (e.g., the basic driving circuit and the compensation driving circuit) of second pixels according to various embodiments is illustrated in FIG. 9.

Figure 9:
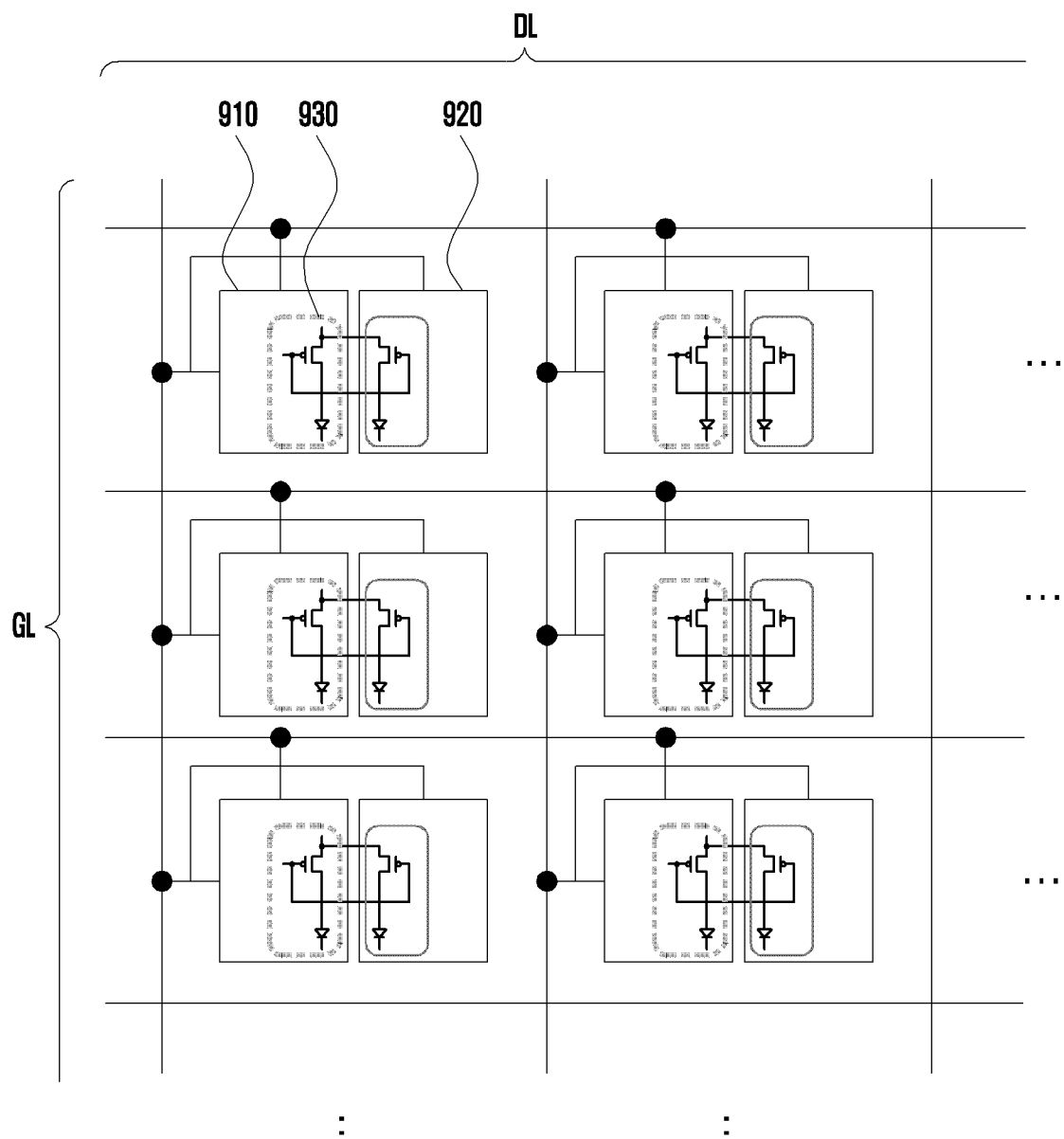
FIG. 9 is a diagram illustrating an example of a pixel structure implemented in a low-resolution area of a display area in a display according to various embodiments.

FIG. 9 is a diagram illustrating an example of a pixel structure implemented in a low-resolution area of a display area in a display according to various embodiments.

As shown in FIG. 9, FIG. 9 may show an embodiment in which some of a plurality of pixels (e.g., second pixels) formed (or arranged) in a low-resolution area are enlarged. A pixel 910 in a low-resolution area (hereinafter, referred to as a "second pixel") according to various embodiments may be configured as, for example, a basic driving circuit 930 for driving the second pixel 910 and a compensation driving circuit 920 for compensating for brightness. In various embodiments, although the compensation driving circuit 920 is illustrated independently of the basic driving circuit 930, the disclosure is not limited thereto, and the compensation driving circuit 920 may be electrically connected to the basic driving circuit 930 in the second pixel 910, and may operate as a driving circuit for the second pixel 910. The basic driving circuit 930 illustrated in FIG. 9 may represent parts of the driving circuit described with reference to FIGS. 3 and 4 above (e.g., one thin-film transistor related to the compensation driving circuit 920, among m switches (e.g., thin-film transistors), and a light-emitting element).

Referring to FIG. 9, the compensation driving circuit 920 may include, for example, at least one thin-film transistor and at least one light-emitting element (or an organic material) (e.g., an organic light-emitting diode (OLED)). According to an embodiment, the compensation driving circuit 920 may be configured as, for example, m switches (e.g., thin-film transistors) and n light-emitting elements of the driving circuit described with reference to FIG. 4. In an embodiment, m and n may be the same number or different numbers. For example, the compensation driving circuit 920 may be configured as a number of switches (e.g., seven thin-film transistors) corresponding to the basic driving circuit 930 and light-emitting elements corresponding to the light-emitting elements of the basic driving circuit 930. As another example, the compensation driving circuit 920 may be configured as one switch (e.g., a thin-film transistor) connected to the light-emitting element of the basic driving circuit 930 and one light-emitting element corresponding to the light-emitting element of the basic driving circuit 930. According to various embodiments, the compensation driving circuit 920 may be configured to replace the removed data line DL and receive a signal from the data driver through the data line DL to which the basic driving circuit 930 is connected.

According to an embodiment, the light-emitting element of the compensation driving circuit 920 may correspond to the light-emitting element of the basic driving circuit 930. For example, in the case where the light-emitting element of the basic driving circuit 930 is a red light-emitting element according to a red subpixel, the light-emitting element of the compensation driving circuit 920 may also be implemented as a red light-emitting element. For example, the compensation driving circuit 920 may be configured to further implement the thin-film transistor and the light-emitting element of the basic driving circuit 930. Although the compensation driving circuit 920 is illustrated and described as an independent configuration for convenience of explanation in FIG. 9, the compensation driving circuit 920 may be included in the second pixel 910, and may be divided for each pixel.

According to an embodiment, the compensation driving circuit 920 may further connect one or more thin-film transistors to the basic driving circuit 930 associated with the second pixel 910, and may include one or more light-emitting elements corresponding to the number of the one or more added thin-film transistors. According to an embodiment, the light-emitting elements of the compensation driving circuit 920 may be formed such that the number thereof corresponds to the number of thin-film transistors to be added or such that the area of the light-emitting element is increased in proportion to the number of thin-film transistors. Examples of a design structure of a second pixel including the compensation driving circuit 920 according to various embodiments are illustrated in FIGS. 10A, 10B, and 10C.

Figure 10A:
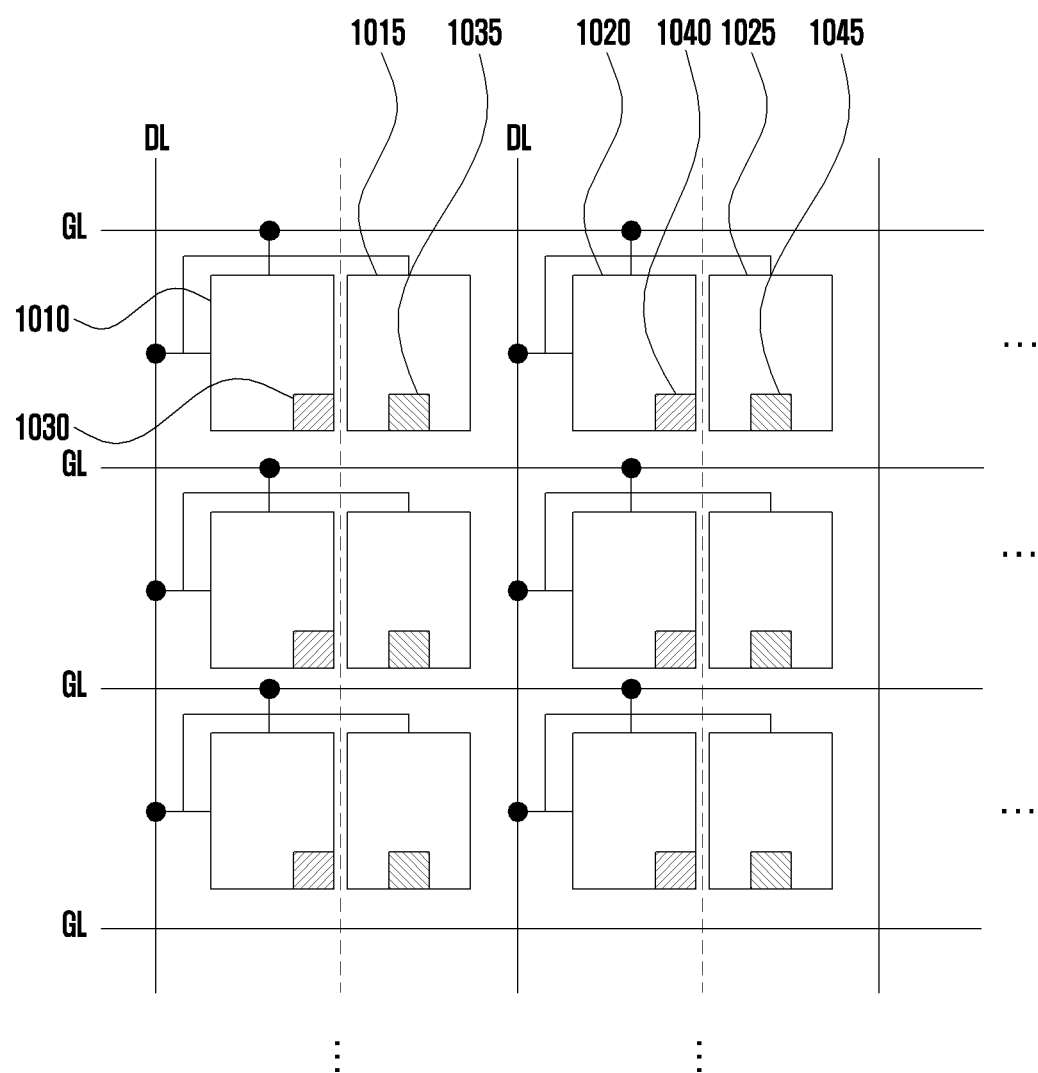
FIGS. 10A, 10B, and 10C are diagrams illustrating examples of a pixel structure of a display according to various embodiments.
Figure 10B:
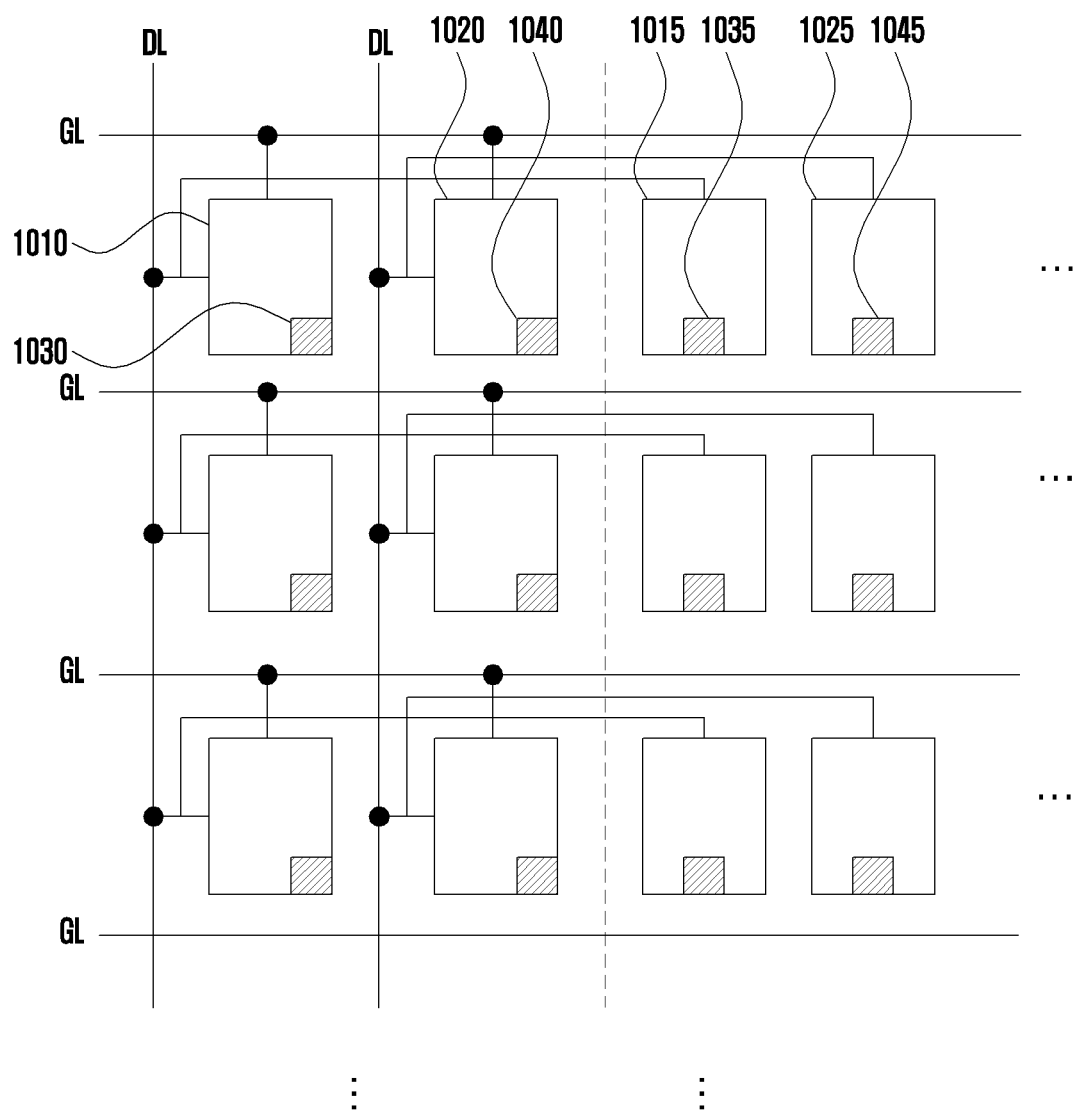
Figure 10C:
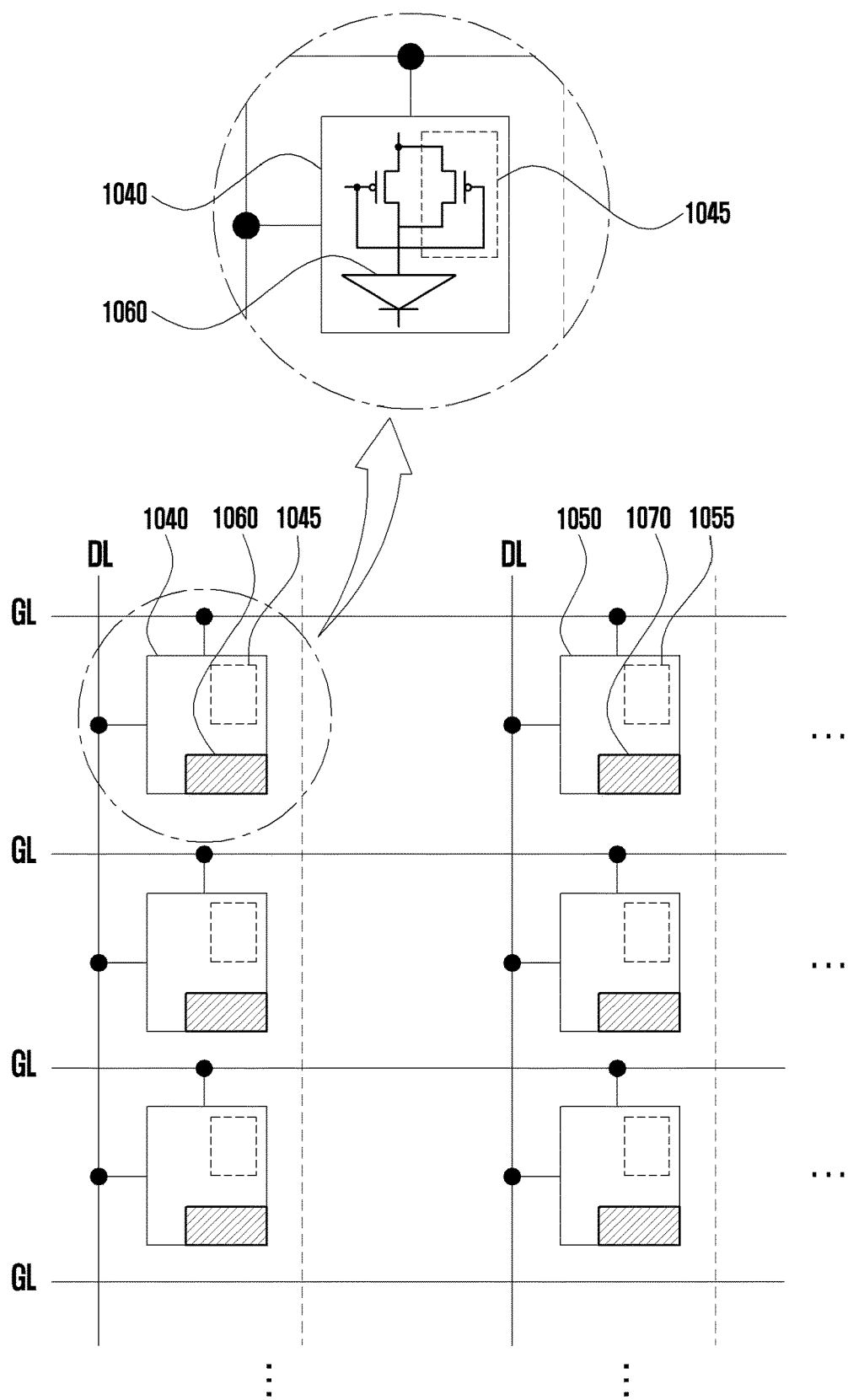

FIGS. 10A, 10B, and 10C are diagrams illustrating examples of a pixel structure of a display according to various embodiments.

In various embodiments, FIGS. 10A, 10B, and 10C may show an embodiment of some of the pixels (e.g., second pixels) formed in a low-resolution area of a display area in a display. For example, a pixel for compensating for brightness in a low-resolution area may include a compensation driving circuit (or a dummy driving circuit) that is formed in a dummy structure (or in a duplicate structure) of at least some elements of a basic driving circuit (e.g., the thin-film transistor and the light-emitting element as shown in the driving circuit 930 in FIG. 9). For convenience of description, a light-emitting element of a basic driving circuit and a light-emitting element of a compensation driving circuit of a pixel are schematically illustrated in FIGS. 10A, 10B, and 10C.

As shown in FIGS. 10A and 10B, pixels 1010 and 1020 in the low-resolution area may include a plurality of light-emitting elements 1030, 1035, 1040, and 1045 at the positions at which third wires (e.g., at least some data lines DL that are not cut from the low-resolution area, among all of the data lines DL) and second wires (e.g., at least some gate lines GL passing through the low-resolution area, among all of the gate lines GL) are electrically connected. For example, the pixels 1010 and 1020 may include first light-emitting elements 1030 and 1040 of basic driving circuits (e.g., the basic driving circuit 930 in FIG. 9) and second light-emitting elements 1035 and 1045 of compensation driving circuits 1015 and 1025 (e.g., the compensation driving circuit 920 in FIG. 9). According to an embodiment, the pixel 1010 or 1020 may be configured to include a default (or one) first light-emitting element 1030 or 1040 for each pixel, and a second light-emitting element 1035 or 1045 corresponding to the duplication of the first light-emitting element 1030 or 1040 such that the second pixels include a plurality of light-emitting elements.

According to an embodiment, driving circuits for driving the second pixels 1010 and 1020 may include basic driving circuits as described with reference to FIG. 4 and compensation driving circuits 1015 and 1025 formed in a dummy structure (or a duplicate structure) of at least a part of the basic driving circuits. According to an embodiment, the compensation driving circuits 1015 and 1025 may be formed to have a size (e.g., a pixel size) corresponding to, for example, the second pixels 1010 and 1020, or may be formed to have a size smaller than the size (e.g., a pixel size) corresponding to the second pixels 1010 and 1020. For example, if the compensation driving circuits 1015 and 1025 are configured as m switches and one light-emitting element corresponding to the basic driving circuit, for example, in the case where all elements of the second pixels 1010 and 1020 are duplicated, the compensation driving circuits 1015 and 1025 may be formed to have the same pixel size as the second pixels 1010 and 1020. As another example, in the case where the compensation driving circuits 1015 and 1025 duplicate some elements of the basic driving circuit (e.g., one switch and one light-emitting element as the basic driving circuit 930 in FIG. 9), the compensation driving circuits 1015 and 1025 may be formed to have a different (e.g., smaller) pixel size than the second pixels 1010 and 1020.

According to various embodiments, the second light-emitting elements 1035 and 1045 may be formed in a dummy (or duplicate) form corresponding to the first light-emitting elements 1030 and 1040. For example, in the case where the first light-emitting element 1030 of the pixel 1010 (e.g., a red subpixel) is a red light-emitting element, the second light-emitting element 1035 of the compensation driving circuit 1015 of the pixel 1010 may be formed of a red light-emitting element. For example, in the case where the first light-emitting element 1040 of the pixel 1020 (e.g., a green subpixel) is a green light-emitting element, the second light-emitting element 1045 of the compensation driving circuit 1025 of the pixel 1020 may be formed of a green light-emitting element.

According to an embodiment, as shown in FIG. 10A, the compensation driving circuits 1035 and 1045 may be formed (or disposed) in the area adjacent to the respective pixels 1010 and 1020 (or in the areas included in the respective pixels 1010 and 1020) between the pixels 1010 and 1020. According to an embodiment, as shown in FIG. 10B, the compensation driving circuits 1035 and 1045 may be formed (or arranged) so as to be shifted (or jump) to the pixel area from which some of the first wires (e.g., the data lines DL) are removed in the low-resolution area.

According to an embodiment, as shown in FIGS. 10A and 10B, a plurality of first pixels among the plurality of pixels formed in a display area, may include, for example, one light-emitting element (e.g., 1030 or 1040) at each of positions at which a plurality of first wires (e.g., data line DL) and a plurality of second wires (e.g., gate lines GL) are electrically connected. According to an embodiment, a plurality of second pixels 1010 and 1020 formed in a low-resolution area of the display area may include, for example, a plurality of light-emitting elements (e.g., the first light-emitting elements 1030 and 1040 of the basic driving circuits and the second light-emitting elements 1035 and 1045 of the compensation driving circuits 1015 and 1025) at the positions at which a plurality of second wires (e.g., the gate lines GL) and a plurality of third wires (e.g., at least some of the data lines DL) are electrically connected.

As shown in FIG. 10C, the pixels 1040 and 1050 in the low-resolution area may include light-emitting elements 1060 and 1070 having an area greater than a specified area at the positions at which third wires (e.g., at least some data lines DL that are not cut from the low-resolution area, among all of the data lines DL) and second wires (e.g., at least some gate lines GL that pass through the low-resolution area, among all of the gate lines GL) are electrically connected. In an embodiment, the specified area (or size or area) may represent, for example, the area of the light-emitting element formed (or disposed) in the basic driving circuit.

According to an embodiment, in the case of the example shown in FIG. 10C, the light-emitting elements of the basic driving circuits of the pixels 1040 and 1050 may be formed to have an area greater than a specified area, and, in general, the compensation driving circuits 1045 and 1055 may be configured such that the light-emitting elements are removed therefrom and such that only thin-film transistors having a large area are included for the light-emitting elements 1060 and 1070. For example, as shown in the partially enlarged example in FIG. 10C, the light-emitting element 1060 may be formed to have a relatively greater area than the light-emitting element shown in FIG. 9. According to an embodiment, the light-emitting element 1060 may be configured to be connected to a first switch (e.g., a thin-film transistor) of the basic driving circuit and a second switch (e.g., a thin-film transistor duplicated based on the first switch) of the compensation driving circuit and have an area greater than a specified area. According to various embodiments, the area of the light-emitting element 1060, which is greater than a specified area, is not limited to a specified area, and may be variously implemented according to the implementation of the switches.

According to an embodiment, the compensation driving circuits 1045 and 1055 may be formed (or disposed) to be included in the respective pixels 1040 and 1050 at the positions between the pixels 1040 and 1050, as shown in FIG. 10C.

According to an embodiment, as shown in FIG. 10C, a plurality of first pixels among the plurality of pixels formed in a display area may include, for example, first light-emitting elements (e.g., the light-emitting elements shown in FIG. 9) having a specified area at the positions at which a plurality of first wires (e.g., the data lines DL) and a plurality of second wires (e.g., the gate lines GL) are electrically connected. According to an embodiment, a plurality of second pixels 1040 and 1050 formed in the low-resolution area of the display area may include, for example, second light-emitting elements 1060 and 1070 having an area greater than a specified area at the positions at which a plurality of second wires (e.g., the gate lines GL) and a plurality of third wires (e.g., at least some of the data lines DL) are electrically connected.

According to various embodiments, as shown in FIGS. 10A, 10B, and 10C, a plurality of first driving circuits (e.g., the basic driving circuits) for driving a plurality of first pixels, and a plurality of second driving circuits (e.g., the compensation driving circuits) for driving a plurality of second pixels in the low-resolution area may be included. According to an embodiment, the plurality of first driving circuits may include a specified number (e.g., one or more) of first switches (e.g., thin-film transistors) capable of driving a plurality of first light-emitting elements included in the plurality of first pixels. According to an embodiment, the plurality of second driving circuits may include (e.g., one or more) more than a specified number of second switches (e.g., a thin-film transistor connected to a light-emitting element of the cathode terminal of the basic driving circuit and a thin-film transistor connected to a light-emitting element of the cathode terminal of the compensation driving circuit), which are capable of driving a plurality of second light-emitting elements (e.g., a light-emitting element of the basic driving circuit and at least one light-emitting element of the compensation driving circuit) included in a plurality of second pixels.

Figure 11:
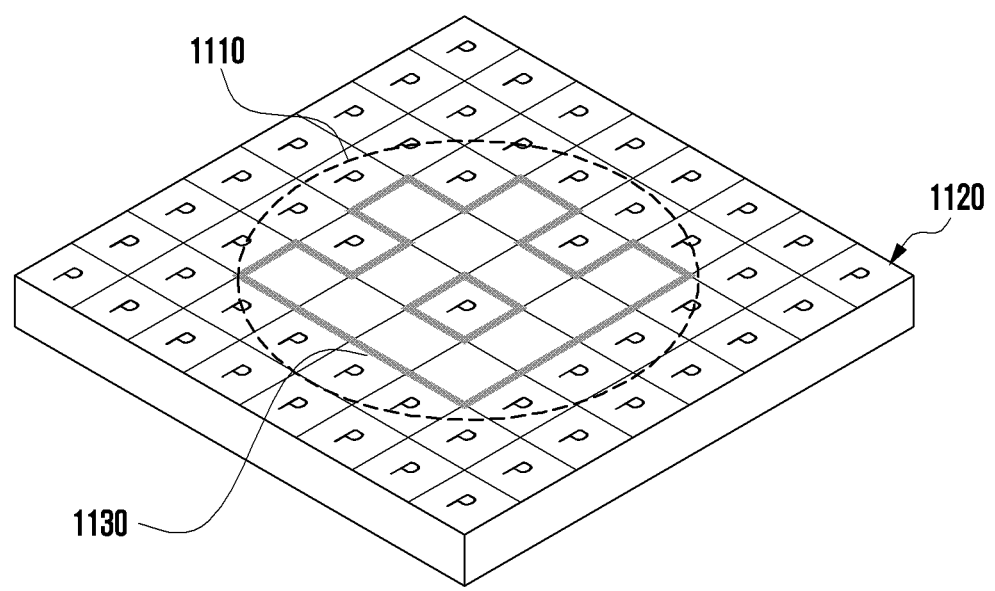
FIG. 11 is a diagram schematically illustrating another example of a wiring structure in a sensor hole area of a display according to various embodiments.

FIG. 11 is a diagram schematically illustrating another example of a wiring structure of a sensor hole area in a display according to various embodiments.

In various embodiments, compared to the example shown in FIG. 7B above, FIG. 11 may show an example of a pixel structure in the case in which some pixels are removed from a transparent window area 1110 formed above a sensor, instead of removing all pixels from the transparent window area 1110. For example, FIG. 11 may show an example of a design scheme in which some of the pixels are removed from the transparent window area 1110 in order to improve the transmittance of a panel above the sensor.

As shown in FIG. 11, some pixels (e.g., blank pixel areas corresponding to elements 1130) among all pixels 1120 in the transparent window area 1110 may be removed therefrom, and the remaining pixels may be provided in the transparent window area 1110.

According to an embodiment, one pixel may include M (e.g., 7) thin-film transistors (e.g., TR1 to TR7) and one capacitor CST as shown in FIG. 4, and in this case, the aperture ratio of the transparent window area 1110 may be, for example, approximately 30% or less. For example, as shown in FIG. 11, assuming that the area of one pixel is 100% when viewing the pixel 1120 in a top view (e.g., when viewing the screen at a right angle from above), the ratio of the area (e.g., an opening) through which light passes may be 30% or less. Accordingly, in various embodiments, at least some pixels may be removed from the transparent window area 1110, and a compensation driving circuit may be formed (or disposed) in order to compensate for deterioration of brightness in at least a portion of the area 1130 from which the pixels are removed. According to an embodiment, since the compensation driving circuit is implemented with, for example, one thin-film transistor and one light-emitting element, it is possible to attain a high aperture ratio approximately more than twice as high as the aperture ratio of one pixel. Examples of a design structure of a pixel including a compensation driving circuit in the transparent window area 1110 according to various embodiments are illustrated in FIGS. 12A, 12B, and 12C.

Figure 12A:
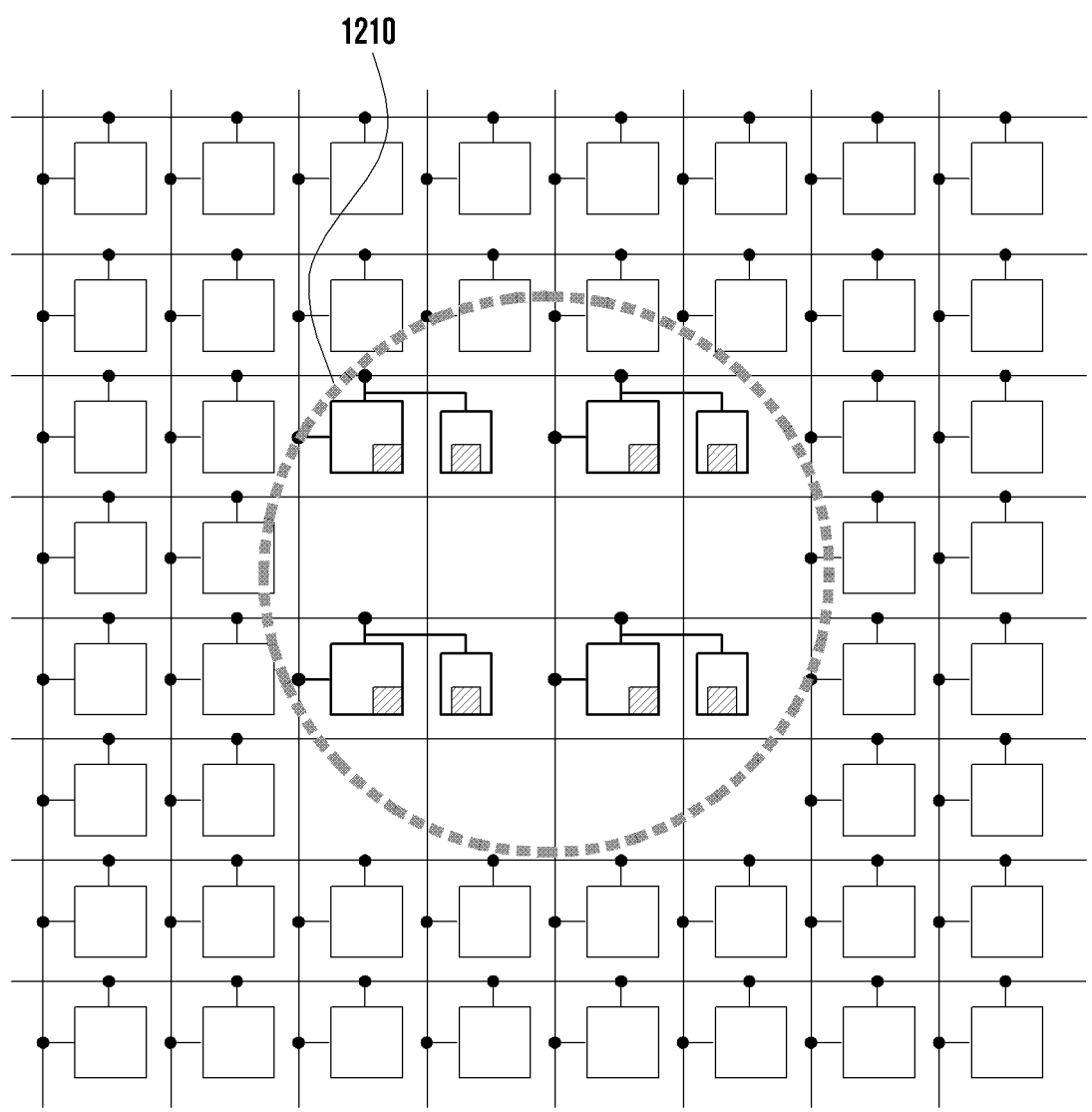
FIGS. 12A, 12B, and 12C are diagrams illustrating examples of a pixel structure of a display according to various embodiments.
Figure 12B:
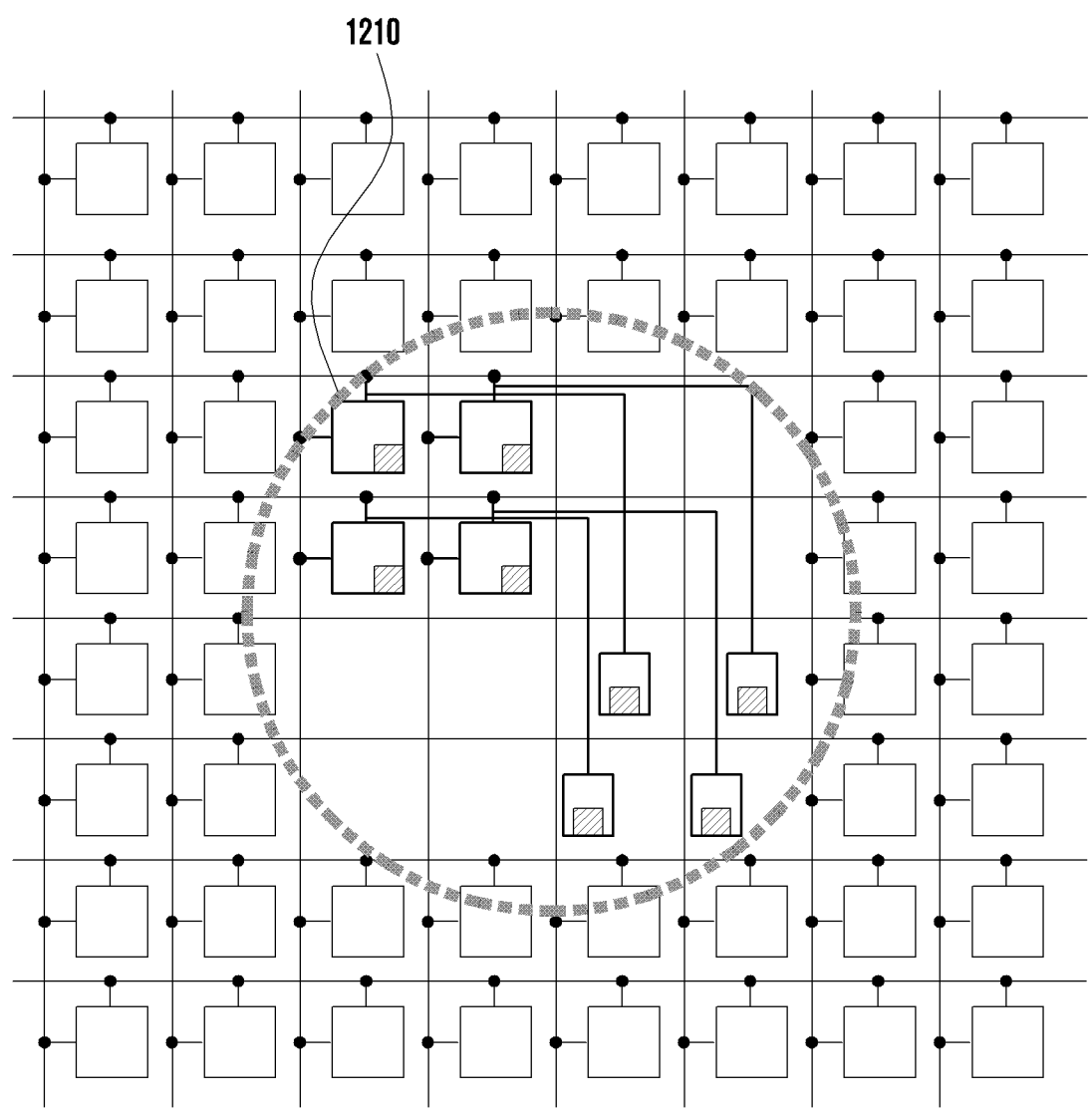
Figure 12C:
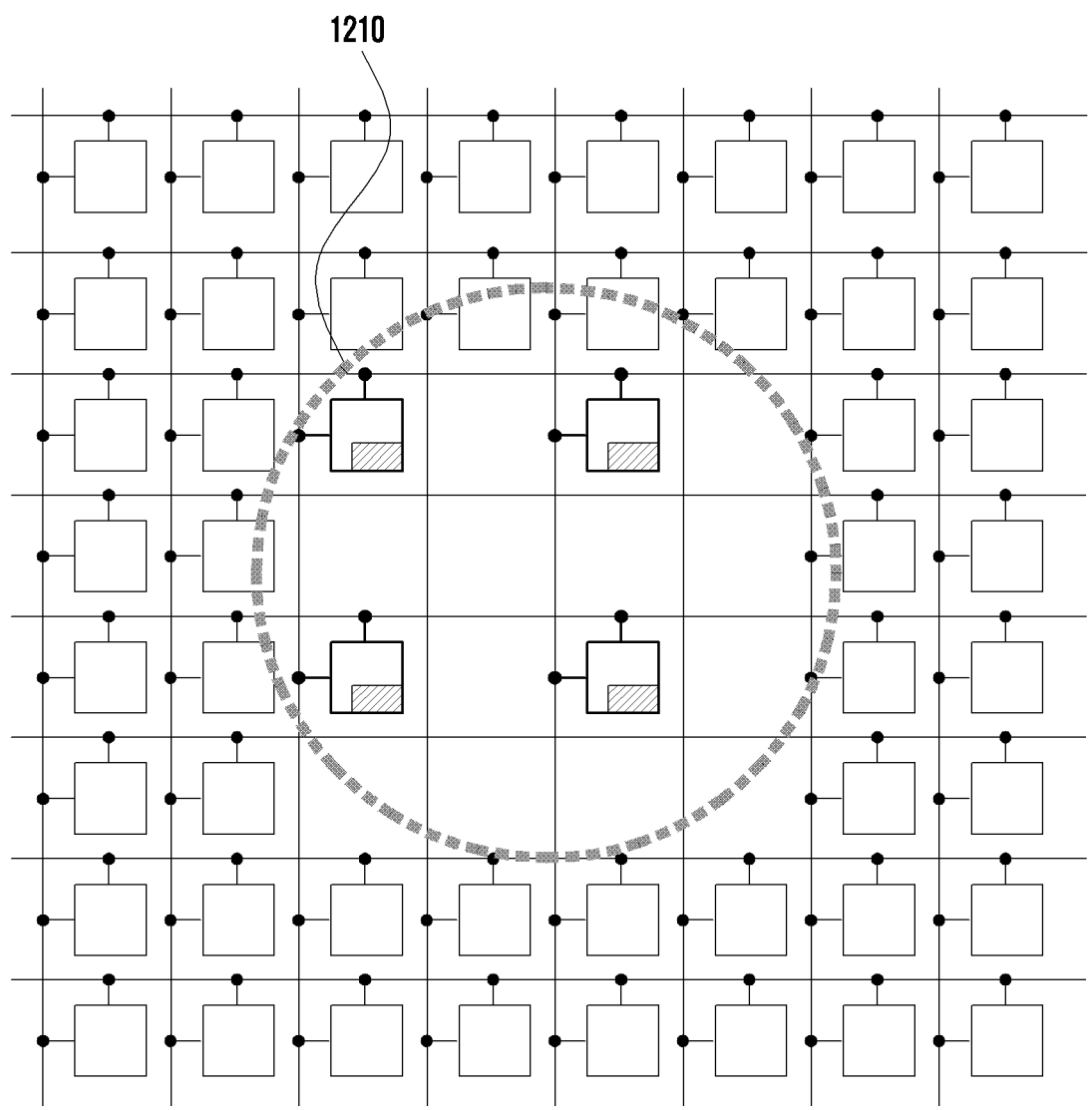

FIGS. 12A, 12B, and 12C are diagrams illustrating examples of a pixel structure of a display according to various embodiments.

In various embodiments, FIGS. 12A, 12B, and 12C may show embodiments of some pixels formed in a transparent window area 1210 of the display area in the display. For example, in order to compensate for brightness due to a reduction in the number of pixels in the transparent window area 1210, compensation driving circuits (e.g., a dummy driving circuit) formed in a dummy form of at least some elements of the basic driving circuits of some pixels may be included in the transparent window area 1210. For convenience of understanding, FIGS. 12A, 12B, and 12C schematically illustrate a light-emitting element of a basic driving circuit and a light-emitting element of a compensation driving circuit in the pixel.

As shown in FIGS. 12A, 12B, and 12C, a pixel including or independently configuring the compensation driving circuit may be formed (or arranged) in the transparent window area 1210 so as to have a form (or structure) corresponding to that described with reference to FIGS. 10A, 10B and 10C, so a detailed description thereof will be omitted.

According to an embodiment, as shown in FIGS. 12A and 12B, the pixels in the transparent window area 1210 may include a plurality of light-emitting elements (e.g., a first light-emitting element of a basic driving circuit and a second light-emitting element of a compensation driving circuit) at the positions at which third wires (e.g., at least some data lines DL that are not cut from the low-resolution area, among all the data lines DL) and second wires (e.g., at least some gate lines GL that pass through the transparent window area 1210, among all the gate lines GL) are electrically connected. According to an embodiment, the second light-emitting element may be formed in a dummy form corresponding to the first light-emitting element. For example, in the case where the first light-emitting element of a pixel (e.g., a red subpixel) is a red light-emitting element, the second light-emitting element of the compensation driving circuit may be formed of a red light-emitting element. As another example, in the case where the first light-emitting element of a pixel (e.g., a green subpixel) is a green light-emitting element, the second light-emitting element of the compensation driving circuit may be formed of a green light-emitting element.

According to an embodiment, as shown in FIG. 12C, the pixels in the transparent window area 1210 may include light-emitting elements having an area greater than a specified area at the positions at which third wires (e.g., at least some data lines DL that are not cut from the transparent window area 1210, among all the data lines DL) and second wires (e.g., at least some gate lines GL that pass through the transparent window area 1210, among all the gate lines GL) are electrically connected. In an embodiment, the specified area (or size or area) may represent, for example, the area of the light-emitting element formed (or disposed) in the basic driving circuit. According to an embodiment, in the case of the example shown in FIG. 12C, the light-emitting element of the basic driving circuit of the pixel may be formed to have an area greater than a specified area, and, in general, the compensation driving circuits may be configured such that the light-emitting elements are removed therefrom and such that only thin-film transistors having a large area are included for the light-emitting elements.

As described above, an electronic device 101 according to various embodiments of the disclosure may include a display including a display area having a plurality of pixels and a plurality of wires, and the display may include: a hole area encompassed by the display area; a plurality of first wires, among the plurality of wires, extending from a first side of the display area so as to be formed at a first interval and connected to the opposite side of the first side; second wires, among the plurality of wires, extending from a second side of the display area to the opposite side of the second side so as to be arranged at the first interval; and a plurality of third wires, among the plurality of wires, extending from the first side of the display area so as to be formed at a second interval, which is greater than the first interval, and bypassing the hole area so as to be connected to the opposite side of the first side.

According to various embodiments, the plurality of pixels may include: a plurality of first pixels electrically connected to the plurality of first wires and the plurality of second wires; and a plurality of second pixels electrically connected to the plurality of first wires and the plurality of third wires.

According to various embodiments, the plurality of first pixels may include one light-emitting element at a position at which the plurality of first wires and the plurality of second wires are electrically connected, and the plurality of second pixels may include a plurality of light-emitting elements at positions at which the plurality of first wires and the plurality of third wires are electrically connected.

According to various embodiments, the plurality of first pixels may include first light-emitting elements having a specified area at positions at which the plurality of first wires and the plurality of second wires are electrically connected, and the plurality of second pixels may include second light-emitting elements having an area greater than the specified area at positions at which the plurality of first wires and the plurality of third wires are electrically connected.

According to various embodiments, the electronic device may further include: a plurality of first driving circuits configured to drive the plurality of first pixels; and a plurality of second driving circuits configured to drive the plurality of second pixels, wherein the plurality of first driving circuits may include a specified number of first switches capable of driving a plurality of first light-emitting elements included in the plurality of first pixels, and wherein the plurality of second driving circuits may include a number of second switches greater than the specified number, which are capable of driving a plurality of second light-emitting elements included in the plurality of second pixels.

According to various embodiments, the second light-emitting elements included in the plurality of second pixels may be formed to correspond in number to the number of second switches.

According to various embodiments, the third wires bypassing the hole area are formed at a third interval, which is smaller than the first interval.

According to various embodiments, an area of the third wires formed at the second interval in the area between the hole area and an edge of the display may be an area having a resolution below a specified range (e.g., a low-resolution area).

As described above, an electronic device according to various embodiments may include a display including a display area having a plurality of pixels and a plurality of wires, and the display may include: a hole area encompassed by the display area; a plurality of first wires, among the plurality of wires, extending from a first side of the display area so as to be formed at a first interval and bypassing the hole area so as to be connected to the opposite side of the first side; second wires, among the plurality of wires, extending from a second side of the display area to the opposite side of the second side so as to be arranged at the first interval; and a plurality of third wires, among the plurality of wires, extending from the first side of the display area so as to be formed at a second interval, which is greater than the first interval, and connected to the opposite side of the second side through at least a portion of the hole area.

According to various embodiments, the plurality of pixels may include a plurality of first pixels electrically connected to the plurality of first wires and the plurality of second wires and a plurality of second pixels electrically connected to the plurality of first wires and the plurality of third wires.

According to various embodiments, the plurality of first pixels may include one light-emitting element at a position at which the plurality of first wires and the plurality of second wires are electrically connected, and the plurality of second pixels may include a plurality of light-emitting elements at positions at which the plurality of first wires and the plurality of third wires are electrically connected.

According to various embodiments, the plurality of first pixels may include first light-emitting elements having a specified area at positions at which the plurality of first wires and the plurality of second wires are electrically connected, and the plurality of second pixels may include second light-emitting elements having an area greater than the specified area at positions at which the plurality of first wires and the plurality of third wires are electrically connected.

According to various embodiments, the electronic device may further include a plurality of first driving circuits configured to drive the plurality of first pixels and a plurality of second driving circuits configured to drive the plurality of second pixels, wherein the plurality of first driving circuits may include a specified number of first switches capable of driving a plurality of first light-emitting elements included in the plurality of first pixels, and wherein the plurality of second driving circuits may include a number of second switches greater than the specified number, which are capable of driving a plurality of second light-emitting elements included in the plurality of second pixels.

According to various embodiments, the second light-emitting elements included in the plurality of second pixels may be formed to correspond in number to the number of second switches.

According to various embodiments, the third wires bypassing the hole area may be formed at a third interval, which is smaller than the first interval.

According to various embodiments, an area of the third wires formed at the second interval in the area between the hole area and an edge of the display may be an area having a resolution below a specified range.

As described above, a display 210, 310, or 510 of an electronic device 101 according to various embodiments of the disclosure may include: a display area having a plurality of pixels and a plurality of wires; a hole area encompassed by the display area; a first pixel electrically connected to a specified wire in a first portion of the display area and formed to have a first resolution; and a second pixel connected to a wire to which the first pixel is electrically connected in a second portion of the display area and formed to have a second resolution, wherein the second portion may include an area between an upper side of the hole area and an edge of the display in the display area, and wherein the second resolution may be less than the first resolution.

As described above, an electronic device 101 according to various embodiments of the disclosure may include: a display including a display area having a plurality of pixels and a plurality of wires; and at least one sensor provided in the display area of the display, wherein the display may include at least one hole area in the display area through which the at least one sensor passes, wherein a first pixel may be formed in a first portion of the display area so as to have a first resolution, wherein a second pixel may be formed in a second portion of the display area so as to have a second resolution, wherein the second portion may include an area between the hole area and an edge of the display in the display area, and wherein the second resolution may be less than the first resolution.

According to various embodiments, the area between the hole area and the edge of the display may include an area facing an area in which a data driver configured to supply data voltages to the plurality of pixels is formed.

According to various embodiments, at least some of the wires in the first portion of the display area may be removed from the second portion in which the second pixel is formed, and the wires may be formed in the second portion at a second interval greater than a first interval of wires in the first portion.

According to various embodiments, the second pixels may include a basic driving circuit configured to drive a pixel and a compensation driving circuit configured to compensate for brightness, based on the low resolution of the second portion, and the compensation driving circuit may be formed in a dummy structure of at least some elements of the basic driving circuit.

Various embodiments of the disclosure disclosed in the specification and drawings are merely provided as specific examples for ease of description of the technical concept of the disclosure and to assist with understanding of the disclosure, and are not intended to limit the scope of the disclosure. Therefore, the scope of the disclosure must be construed to encompass all changes or modifications derived based on the technical idea of the disclosure, as well as the embodiments disclosed herein.

The invention claimed is:

1. An electronic device comprising
a display comprising a display area having a plurality of pixels and a plurality of wires,
wherein the display comprises:
   a hole area encompassed by the display area,
   a plurality of first wires, among the plurality of wires, extending from a first side of the display area so as to be formed at a first interval and connected to the opposite side of the first side,
   second wires, among the plurality of wires, extending from a second side of the display area to the opposite side of the second side so as to be arranged at the first interval, and
   a plurality of third wires, among the plurality of wires, extending from the first side of the display area so as to be formed at a second interval, greater than the first interval, and bypassing the hole area so as to be connected to the opposite side of the first side, and
wherein the plurality of pixels comprises:
   a plurality of first pixels electrically connected to the plurality of first wires and the plurality of second wires, and
   a plurality of second pixels electrically connected to the plurality of first wires and the plurality of third wires.

2. The electronic device of claim 1,
wherein the plurality of first pixels comprises one light-emitting element at a position at which the plurality of first wires and the plurality of second wires are electrically connected, and
wherein the plurality of second pixels comprises a plurality of light-emitting elements at positions at which the plurality of first wires and the plurality of third wires are electrically connected.

3. The electronic device of claim 1,
wherein the plurality of first pixels comprises first light-emitting elements having a specified area at positions at which the plurality of first wires and the plurality of second wires are electrically connected, and
wherein the plurality of second pixels comprises second light-emitting elements having an area greater than the specified area at positions at which the plurality of first wires and the plurality of third wires are electrically connected.

4. The electronic device of claim 1, further comprising:
a plurality of first driving circuits configured to drive the plurality of first pixels; and a plurality of second driving circuits configured to drive the plurality of second pixels, wherein the plurality of first driving circuits comprises a specified number of first switches capable of driving a plurality of first light-emitting elements included in the plurality of first pixels, and wherein the plurality of second driving circuits comprises a number of second switches greater than the specified number, which are capable of driving a plurality of second light-emitting elements included in the plurality of second pixels.

5. The electronic device of claim 4, wherein the second light-emitting elements included in the plurality of second pixels are formed to correspond in number to the number of second switches.

6. The electronic device of claim 1, wherein the third wires bypassing the hole area are formed at a third interval, which is smaller than the first interval, and wherein an area of the third wires formed at the second interval in the area between the hole area and an edge of the display is an area having a resolution below a specified range.

7. An electronic device comprising a display comprising a display area having a plurality of pixels and a plurality of wires, wherein the display comprises:

a hole area encompassed by the display area, a plurality of first wires, among the plurality of wires, extending from a first side of the display area so as to be formed at a first interval and bypassing the hole area so as to be connected to the opposite side of the first side, second wires, among the plurality of wires, extending from a second side of the display area to the opposite side of the second side so as to be arranged at the first interval, and a plurality of third wires, among the plurality of wires, extending from the first side of the display area so as to be formed at a second interval, greater than the first interval, and connected to the opposite side of the second side through at least a portion of the hole area, and wherein the plurality of pixels comprises:

a plurality of first pixels electrically connected to the plurality of first wires and the plurality of second wires, and a plurality of second pixels electrically connected to the plurality of first wires and the plurality of third wires.

8. The electronic device of claim 7, further comprising:

a plurality of first driving circuits configured to drive the plurality of first pixels, and a plurality of second driving circuits configured to drive the plurality of second pixels, wherein the plurality of first driving circuits comprises a specified number of first switches capable of driving a plurality of first light-emitting elements included in the plurality of first pixels, and wherein the plurality of second driving circuits comprises a number of second switches greater than the specified number, which are capable of driving a plurality of second light-emitting elements included in the plurality of second pixels.

9. The electronic device of claim 8, wherein the plurality of first pixels comprises one light-emitting element at a position at which the plurality of first wires and the plurality of second wires are electrically connected, and wherein the plurality of second pixels comprises a plurality of light-emitting elements at positions at which the plurality of first wires and the plurality of third wires are electrically connected.

10. The electronic device of claim 8, wherein the plurality of first pixels comprises first light-emitting elements having a specified area at positions at which the plurality of first wires and the plurality of second wires are electrically connected, and wherein the plurality of second pixels comprises second light-emitting elements having an area greater than the specified area at positions at which the plurality of first wires and the plurality of third wires are electrically connected.

11. An electronic device comprising:

a display comprising a display area having a plurality of pixels and a plurality of wires; and at least one sensor provided in the display area of the display, wherein the display comprises at least one hole area in the display area through which the at least one sensor passes, wherein a first pixel is formed in a first portion of the display area so as to have a first resolution, wherein a second pixel is formed in a second portion of the display area so as to have a second resolution, wherein the second portion comprises an area between the hole area and an edge of the display in the display area, wherein the second resolution is less than the first resolution, and wherein the plurality of pixels comprises:

a plurality of first pixels electrically connected to a plurality of first wires and a plurality of second wires, and a plurality of second pixels electrically connected to the plurality of first wires and a plurality of third wires.

12. The electronic device of claim 11, wherein the area between the hole area and the edge of the display comprises an area facing an area in which a data driver configured to supply data voltages to the plurality of pixels is formed.

13. The electronic device of claim 12, wherein at least some of the wires in the first portion of the display area are removed from the second portion in which the second pixel is formed, and wherein the wires are formed in the second portion at a second interval greater than a first interval of wires in the first portion.

14. The electronic device of claim 12, wherein the second pixels comprise a basic driving circuit configured to drive a pixel and a compensation driving circuit configured to compensate for brightness, based on a low resolution of the second portion, and wherein the compensation driving circuit is formed in a dummy structure of at least some elements of the basic driving circuit.

* * * * *